(12) United States Patent
Iwai

(10) Patent No.: US 11,588,479 B2
(45) Date of Patent: Feb. 21, 2023

(54) SPREAD SPECTRUM CLOCK GENERATOR AND SPREAD SPECTRUM CLOCK GENERATION METHOD, PULSE PATTERN GENERATOR AND PULSE PATTERN GENERATION METHOD, AND ERROR RATE MEASURING DEVICE AND ERROR RATE MEASURING METHOD

(71) Applicant: ANRITSU CORPORATION, Kanagawa (JP)

(72) Inventor: Tatsuya Iwai, Kanagawa (JP)

(73) Assignee: ANRITSU CORPORATION, Kanagawa (JP)

(*) Notice: Subject to any disclaimer, the term of this patent is extended or adjusted under 35 U.S.C. 154(b) by 0 days.

(21) Appl. No.: 17/551,874

(22) Filed: Dec. 15, 2021

(65) Prior Publication Data
US 2022/0255542 A1 Aug. 11, 2022

(30) Foreign Application Priority Data
Feb. 10, 2021 (JP) .............................. JP2021-019699

(51) Int. Cl.
*G09G 3/20* (2006.01)
*H03K 5/156* (2006.01)
*G06F 1/04* (2006.01)

(52) U.S. Cl.
CPC .............. *H03K 5/156* (2013.01); *G06F 1/04* (2013.01); *G09G 3/20* (2013.01); *G09G 2310/08* (2013.01)

(58) Field of Classification Search
CPC . H03K 5/156; G06F 1/04; G09G 3/20; G09G 2310/08
See application file for complete search history.

(56) References Cited

U.S. PATENT DOCUMENTS

2017/0316728 A1* 11/2017 Lee ...................... G09G 3/3266
2017/0316732 A1* 11/2017 Na ........................... G09G 3/20
2021/0104192 A1* 4/2021 Huang ..................... G09G 3/20

FOREIGN PATENT DOCUMENTS

JP          6606211 B2      11/2019

* cited by examiner

*Primary Examiner* — Sejoon Ahn
(74) *Attorney, Agent, or Firm* — Pearne & Gordon LLP

(57) ABSTRACT

Provided are a spread spectrum clock generator and a spread spectrum clock generation method, a pulse pattern generator and a pulse pattern generation method, and an error rate measuring device and an error rate measuring method capable of improving usability when adjusting a waveform of a modulation signal during training. A setting screen 60 includes a 0-th frequency shift input unit 71 for arbitrarily setting a frequency shift of a waveform of a modulation signal in a plurality of time sections, a first frequency shift input unit 72, a second frequency shift input unit 73, a third frequency shift input unit 74, and a modulation selection unit 67 for switching a waveform pattern of the modulation signal from a first pattern to a second pattern.

14 Claims, 17 Drawing Sheets

| Profile | USB4 ▼ —62 | | START | Recall | Store | Initialize |
|---|---|---|---|---|---|---|
| Type | Asymmetric ▼ —63 | | Modulation | Periodic Burst ▼ —67 | | |

60, 79, 80, 81, 82

List ▼ —61  Initial Frequency [300] ppm  Offset [300] ppm —75
Frequency [32000] Hz —64  71  66  Frame Frequency [8000] Hz
Deviation [5000] ppm —65  Min. Deviation [-5000] ppm  Max. Deviation [0] ppm
85

| Window | Shape | δ Deviation [ppm] | Time [μs] | Slope [ppm/μs] |
|---|---|---|---|---|
| dt0 | Flat | 0 | 31.63 | 0 |
| dt1 | Curved | 1000 | 0.50 | — |
| dt2 | Linear | -1400 | 0.20 | 7000 |
| dt3 | Linear | -800 | 0.80 | 1000 |
| Main | Linear | 5000 | 91.88 | 320 |

84

83
[Graph]

FIG. 7

SPREAD SPECTRUM CLOCK GENERATOR AND SPREAD SPECTRUM CLOCK GENERATION METHOD, PULSE PATTERN GENERATOR AND PULSE PATTERN GENERATION METHOD, AND ERROR RATE MEASURING DEVICE AND ERROR RATE MEASURING METHOD

TECHNICAL FIELD

The present invention relates to a spread spectrum clock generator and a spread spectrum clock generation method which spread a spectrum of a reference signal to generate a spread spectrum clock signal, a pulse pattern generator and a pulse pattern generation method, and an error rate measuring device and an error rate measuring method.

BACKGROUND ART

In recent years, with the spread of IoT and cloud computing, communication systems have come to handle enormous amounts of data, and the interfaces of various types of communication equipment constituting the communication systems are becoming faster and serial transmission is progressing. For example, in the High Speed Serial Bus standards such as Universal Serial Bus (USB (registered trademark)) and Peripheral Component Interconnect Express (PCIe (registered trademark)), the initialization of communication between devices and the adjustment of link speed are managed by Link Training and Status State Machine (LTSSM, hereinafter, referred to as "link state management mechanism"). Further, in the above standard, as an electro-magnetic compatibility (EMC) measure, SSC modulation by a spread-spectrum clocking (SSC) that spreads the spectrum of a reference signal is adopted.

Then, as one of the indexes for evaluating the quality of signals in communication equipment, a bit error rate (BER), which is defined as a comparison between the number of received data in which bit errors occur and the total number of received data, has been known. An error rate measuring device for measuring BER in the related art is provided with a function (sequence pattern function) of controlling the link state management mechanism included in a device under test (DUT) and transitioning to a specific state, by switching and outputting a specific pattern defined by the standard from a pulse pattern generator (PPG) at high speed. The pattern for state transitioning the DUT is defined by the standard, and the error rate measuring device combines the output order of these patterns by the sequence pattern function and outputs the pattern from the PPG.

FIG. 15 illustrates an example of the state transition of the link state management mechanism, and L0, L0s, L1, L2, Detect, Polling, Configuration, Disabled, Hot Reset, Loopback, and Recovery are defined as the states.

Here, in this type of error rate measuring device, when measuring the error rate of DUT, it is necessary to generate a desired pulse pattern signal and input the pulse pattern signal to the DUT, by using a spread spectrum clock signal of which spectrum is spread (hereinafter, also referred to as "SSC modulated signal") and a data signal. Therefore, there is a demand for an SSC generator and a pulse pattern generator capable of generating an SSC modulated signal by a desired spread method.

Then, inside the SSC generator or the pulse pattern generator in the related art, a triangular wave having a predetermined modulation frequency is generated in order to generate an SSC modulated signal, and a reference signal having a predetermined reference frequency is frequency-swept by the triangular wave and frequency-modulated (see, for example, Patent Document 1).

Incidentally, in the USB4 standard, the operation requirement is different between a Steady-state such as the Loopback state illustrated in FIG. 15 and a state during training which is a transition state between the Steady-states.

FIG. 16 illustrates a waveform pattern of a modulation signal waveform (triangular wave) for generating a down spread SSC modulated signal in the Steady-state, and the vertical axis represents the frequency shift of the reference signal with respect to the reference frequency. Hereinafter, the waveform pattern will also be referred to as a "Steady-state mode" waveform pattern. In this example, a center frequency of the frequency shift with respect to the reference frequency is lower than the reference frequency by about 2500 ppm. Further, a slope of the frequency shift of the modulation signal waveform switches between positive and negative in ½ cycle of the triangular wave, but the absolute value is always constant.

FIG. 17A illustrates a waveform pattern of the modulation signal for generating the SSC modulated signal in a state during training of USB4, and a vertical axis represents the frequency shift of the reference signal with respect to the reference frequency. Hereinafter, the waveform pattern will also be referred to as a "periodic burst mode" waveform pattern. The slope of the frequency shift in the time section from a 0-th section (time width dt0) to a third section (time width dt3) of the waveform pattern in the periodic burst mode varies with time unlike the Steady-state. Due to the frequency shift from the 0-th section to the third section, the center frequency of the frequency shift with respect to the reference frequency is larger (the absolute value is smaller) than a case of the Steady-state of FIG. 16. From a fourth section (time width dt4) to an eighth section (time width dt8) of the waveform pattern in the periodic burst mode, the slope of the frequency shift is a triangular wave equal to the Steady-state. At an end of a ninth section (time width dt9) is a time section for returning from the final frequency shift of the eighth section to the frequency shift of the 0-th section. The waveform pattern in the periodic burst mode is repeated with the 0-th section to the ninth section as one frame.

FIG. 17B illustrates the waveform pattern of the modulation signal for transitioning from the periodic burst mode to the Steady-state mode, and a vertical axis represents the frequency shift of the reference signal with respect to the reference frequency. Hereinafter, the waveform pattern will also be referred to as a "continuous mode" waveform pattern. The slope of the frequency shift in the time section from the 0-th section to the third section of the waveform pattern in the continuous mode varies with time unlike the Steady-state. Due to the frequency shift from the 0-th section to the third section, the center frequency of the frequency shift with respect to the reference frequency is larger (the absolute value is smaller) than a case of the Steady-state of FIG. 16. From the fourth section to the ninth section of the waveform pattern in the continuous mode, the slope of the frequency shift is a triangular wave equal to the Steady-state. The waveform pattern in the continuous mode has one frame from the 0-th section to the ninth section, and the waveform pattern in the Steady-state mode is started continuously in the ninth section.

In recent years, many of the various types of communication equipment constituting the communication system do not transmit clock signals for synchronization, but transmit only data signals, and the communication equipment on the receiving side is equipped with a clock recovery circuit that recovers clock signals from the received data signal.

In the state before training, from a state in which a pulse pattern signal based on a reference signal without SSC modulation is input to the DUT, when a pulse pattern signal based on a reference signal with SSC modulation equivalent to the Steady-state is suddenly input to the DUT, the input frequency fluctuation of the clock recovery circuit in the DUT becomes large. Therefore, due to unlock in the clock recovery circuit, the recovered clock is not output, so that the link training cannot be performed correctly. Therefore, in the standards such as USB4, the reference signal without SSC modulation is first SSC-modulated with less frequency shift than the SSC modulation in the Steady-state as illustrated in FIGS. 17A and 17B, so that it is required to suppress the input frequency fluctuation of the clock recovery circuit in the DUT. After the training is completed and the transition to the Steady-state is completed, SSC modulation in the Steady-state can be applied to the reference signal.

RELATED ART DOCUMENT

Patent Document

[Patent Document 1] Japanese Patent No. 6606211

DISCLOSURE OF THE INVENTION

Problem that the Invention is to Solve

An SSC generator according to the related art as disclosed in Patent Document 1 sets a modulation frequency, a modulation amount (maximum amplitude of frequency shift), and a spread method as parameters for determining the waveform of a modulation signal, so that it is possible to generate a triangular wave. However, there is a problem that the setting of the parameters is not enough to generate the waveform of the modulation signal during training of USB4. Therefore, in order to adjust the waveform pattern in the periodic burst mode and the continuous mode described above, an SSC generator is required which is capable of easily setting a parameter such as a unit frequency shift df of the waveform of the modulation signal with respect to the unit time dt.

The present invention has been made to solve such a problem in the related art, and an object is to provide a spread spectrum clock generator and a spread spectrum clock generation method, a pulse pattern generator and a pulse pattern generation method, and an error rate measuring device and an error rate measuring method capable of improving usability when adjusting a waveform of a modulation signal during training.

Means for Solving the Problem

In order to solve the above problems, according to the present invention, there is provided a spread spectrum clock generator including: a reference signal generation source that generates a reference signal of a reference frequency; a modulation signal generator that generates a modulation signal; a modulation unit that frequency-modulates the reference signal using the modulation signal to generate a spread spectrum clock signal; a display unit that displays a setting screen for setting a parameter for determining a waveform of the modulation signal; an operation unit that accepts an operation input with respect to the setting screen; and a modulation control unit that controls the waveform of the modulation signal in response to the operation input with respect to the setting screen, in which the setting screen includes a frequency shift input unit that arbitrarily sets a frequency shift of the waveform of the modulation signal in a plurality of time sections, and a pattern switching input unit that switches a waveform pattern of the modulation signal from a first pattern to a second pattern, and the modulation control unit switches the waveform pattern of the modulation signal from the first pattern to the second pattern when triggered by the operation input to the pattern switching input unit by the operation unit.

With this configuration, the spread spectrum clock generator according to the present invention displays the setting screen for arbitrarily setting the frequency shift of the waveform of the modulation signal in the plurality of time sections, so that it is possible to improve usability when adjusting the waveform of the modulation signal during training. Further, in the spread spectrum clock generator according to the present invention, the setting screen includes the pattern switching input unit for switching the waveform pattern of the modulation signal generated by the modulation signal generator from the first pattern to the second pattern, so that it is possible to perform, for example, seamless change from periodic burst mode to continuous mode.

Further, in the spread spectrum clock generator according to the present invention, the frequency shift input unit may include a 0-th frequency shift input unit that sets the frequency shift of the waveform of the modulation signal in a 0-th section of the plurality of time sections, a first frequency shift input unit that sets the frequency shift of the waveform of the modulation signal at an end of a first section of the plurality of time sections, a second frequency shift input unit that sets the frequency shift of the waveform of the modulation signal in a second section of the plurality of time sections, and a third frequency shift input unit that sets the frequency shift of the waveform of the modulation signal in a third section of the plurality of time sections.

With this configuration, the spread spectrum clock generator according to the present invention can set the frequency shift of the waveform of the modulation signal during training for each time section on the setting screen, so that it is possible to arbitrarily set the frequency shift of the waveform of the modulation signal during training.

Further, in the spread spectrum clock generator according to the present invention, the setting screen may further include a modulation frequency input unit that sets a modulation frequency of the waveform of the modulation signal, and a time width input unit that sets time widths of some of the plurality of time sections, and the modulation control unit includes a time width calculation unit for calculating remaining time widths of the time sections which are not set by the time width input unit based on the modulation frequency set by the modulation frequency input unit and some time widths set by the time width input unit.

With this configuration, the spread spectrum clock generator according to the present invention includes a time width calculation unit that calculates the remaining time widths of the time sections which are not set by the time width input unit, so that it is possible to improve the usability by reducing the number of setting items of the user.

Further, in the spread spectrum clock generator according to the present invention, the setting screen may further include a waveform image display area for displaying a schematic waveform image of the modulation signal, and the waveform image display area may perform display after switching a schematic waveform image of the first pattern to a schematic waveform image of the second pattern when triggered by the operation input to the pattern switching input unit by the operation unit.

With this configuration, the spread spectrum clock generator according to the present invention switches and illustrates the waveform image between the periodic burst mode and the continuous mode in the waveform image display area, so that it is possible for the user to visually identify which mode of the modulation signal is output by the modulation signal generator.

Further, in the spread spectrum clock generator according to the present invention, the setting screen may further include a frequency shift settable location display unit that indicates a location where the frequency shift can be set in the waveform of the modulation signal in association with the waveform image displayed in the waveform image display area, and a time width settable location display unit that indicates a location where the time widths of the plurality of time sections can be set in the waveform of the modulation signal in association with the waveform image displayed in the waveform image display area, and the frequency shift input unit and the time width input unit may be disposed in the vicinities of the frequency shift settable location display unit and the time width settable location display unit, respectively.

With this configuration, the spread spectrum clock generator according to the present invention is disposed with the frequency shift input unit and the time width input unit in association with the waveform image displayed in the waveform image display area. Therefore, the spread spectrum clock generator according to the present invention performs display so that the user can understand the items to be set at a glance, and makes the user to easily imagine the entire waveform of the modulation signal.

Further, in the spread spectrum clock generator according to the present invention, the modulation control unit may further include a slope absolute value calculation unit that calculates an absolute value of a slope of the frequency shift of the waveform of the modulation signal for each time section based on the frequency shift for each time section set by the frequency shift input unit, the time width for each time section set by the time width input unit, and the time width calculated by the time width calculation unit, and the display unit may display the frequency shift input unit, the time width input unit, and the absolute value of the slope calculated by the slope absolute value calculation unit in a list format on the setting screen.

With this configuration, in the spread spectrum clock generator according to the present invention, the setting screen displays the frequency shift input unit, the time width input unit, and the absolute value of the slope calculated by the slope absolute value calculation unit in a list format. Therefore, the spread spectrum clock generator according to the present invention can clearly display the frequency shift and the slope absolute value information for each time section for easy understanding of the user.

Further, in the spread spectrum clock generator according to the present invention, the display unit may further display a waveform display screen for performing display after updating a graph of the waveform of the modulation signal in response to the operation input with respect to the setting screen.

With this configuration, the spread spectrum clock generator according to the present invention includes the waveform display screen for performing display after updating the waveform graph of the modulation signal in response to the operation input to the setting screen, so that it is possible to display time change of the waveform, which is difficult to understand in the waveform images in the waveform image display area, such that the user can understand the time change of the waveform at a glance.

Further, according to the present invention, there is provided a spread spectrum clock generation method including: a reference signal generation step of generating a reference signal of a reference frequency; a modulation signal generation step of generating a modulation signal; a modulation step of frequency-modulating the reference signal using the modulation signal to generate a spread spectrum clock signal; a display step of displaying a setting screen for setting a parameter for determining a waveform of the modulation signal; an operation step of accepting an operation input with respect to the setting screen; and a modulation control step of controlling the waveform of the modulation signal in response to the operation input with respect to the setting screen, in which the operation step includes a frequency shift input step of arbitrarily setting a frequency shift of the waveform of the modulation signal in a plurality of time sections, and a pattern switching input step of switching a waveform pattern of the modulation signal from a first pattern to a second pattern, and the modulation control step includes switching the waveform pattern of the modulation signal from the first pattern to the second pattern when triggered by the operation input in the pattern switching input step.

Further, in the spread spectrum clock generation method according to the present invention, the frequency shift input step may include a 0-th frequency shift input step of setting the frequency shift of the waveform of the modulation signal in a 0-th section of the plurality of time sections, a first frequency shift input step of setting the frequency shift of the waveform of the modulation signal at an end of a first section of the plurality of time sections, a second frequency shift input step of setting the frequency shift of the waveform of the modulation signal in a second section of the plurality of time sections, a third frequency shift input step of setting the frequency shift of the waveform of the modulation signal in a third section of the plurality of time sections, and a minimum frequency shift input step of setting a minimum value of the frequency shift of the waveform of the modulation signal.

Further, in the spread spectrum clock generation method according to the present invention, the display step may include further displaying a waveform display screen for performing display after updating a graph of the waveform of the modulation signal in response to the operation input with respect to the setting screen.

Further, according to the present invention, there is provided a pulse pattern generator that generates a pulse pattern signal by using the spread spectrum clock signal generated by any of the above spread spectrum clock generators.

With this configuration, the pulse pattern generator according to the present invention can generate the pulse pattern signal with a desired repeating pattern, from the SSC modulated signal from the spread spectrum clock generator and the data signal input from the outside.

Further, according to the present invention, there is provided a pulse pattern generation method including a step of generating a pulse pattern signal by using the spread spectrum clock signal generated by any of the above spread spectrum clock generation methods.

Further, according to the present invention, there is provided an error rate measuring device including: the pulse pattern generator; and an error rate calculation unit that compares a signal under measurement output from a device under test in accordance with an input of a test signal for testing the device under test with the test signal to calculate an error rate of the signal under measurement, in which the test signal is the pulse pattern signal generated by the pulse pattern generator.

With this configuration, the error rate measuring device according to the present invention can measure the error rate of the DUT, by using the pulse pattern signal modulated by the SSC modulated signal as a test signal.

Further, according to the present invention, there is provided an error rate measuring method including: the pulse pattern generation method; and an error rate calculation step of comparing a signal under measurement output from the device under test in accordance with the input of the test signal for testing the device under test with the test signal to calculate an error rate of the signal under measurement, in which the test signal is the pulse pattern signal generated by the pulse pattern generation method.

Advantage of the Invention

The present invention is to provide a spread spectrum clock generator and a spread spectrum clock generation method, a pulse pattern generator and a pulse pattern generation method, and an error rate measuring device and an error rate measuring method capable of improving usability when adjusting a waveform of a modulation signal during training.

BRIEF DESCRIPTION OF THE DRAWINGS

FIG. 7 is a diagram illustrating a display example in a list format of the setting screen in the periodic burst mode in the SSC generator illustrated in FIG. 1.

BEST MODE FOR CARRYING OUT THE INVENTION

Hereinafter, embodiments of a spread spectrum clock generator and a spread spectrum clock generation method, a pulse pattern generator and a pulse pattern generation method, and an error rate measuring device and an error rate measuring method according to the present invention will be described with reference to the drawings. Hereinafter, the USB4 standards will be described as an example.

First Embodiment

Figure 1:
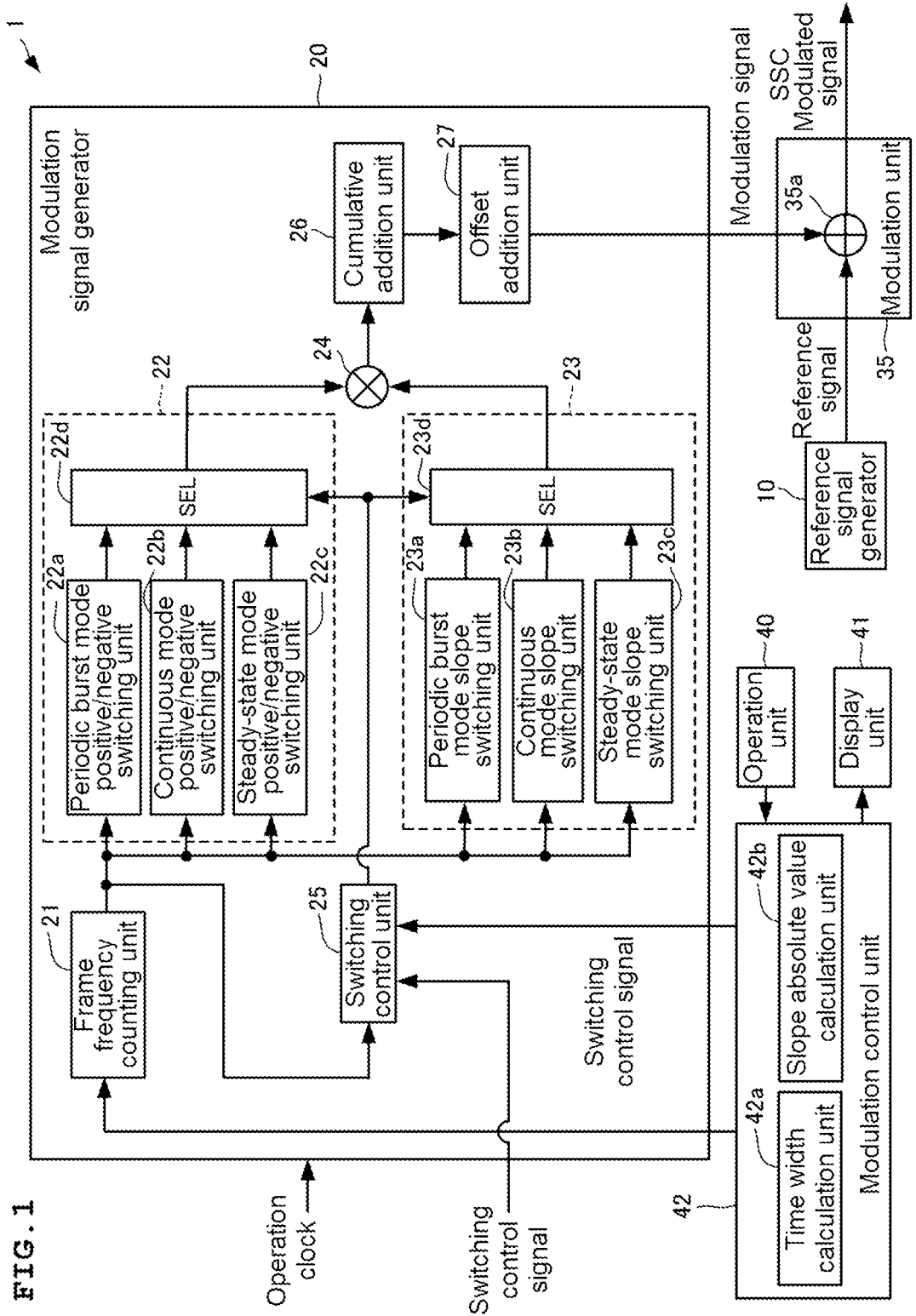
FIG. 1 is a block diagram illustrating a configuration of an SSC generator according to a first embodiment of the present invention.

As illustrated in FIG. 1, a spread spectrum clock generator (hereinafter, also referred to as "SSC generator") 1 according to a first embodiment of the present invention includes a reference signal generation source 10, a modulation signal generator 20, a modulation unit 35, an operation unit 40, a display unit 41, and a modulation control unit 42.

The reference signal generation source 10 generates a reference signal (clock signal) having a reference frequency Fc. The reference frequency Fc is, for example, a frequency of about several GHz.

The modulation signal generator 20 generates a modulation signal for performing SSC modulation with respect to the reference signal, and includes a frame frequency counting unit 21, a slope positive/negative information output unit 22, a slope absolute value information output unit 23, a multiplication unit 24, a switching control unit 25, a cumulative addition unit 26, and an offset addition unit 27. An operation clock that gives a predetermined clock period Tclk is input from the outside to the frame frequency counting unit 21, the slope positive/negative information output unit 22, the slope absolute value information output unit 23, the multiplication unit 24, and the cumulative addition unit 26.

The frame frequency counting unit 21 counts the number of clocks of the operation clock input from the outside, and resets the count value of the number of clocks at the beginning of the frame of the waveform pattern of the modulation signal based on the information of the modulation frequency input from the modulation control unit 42. The count value of the number of clocks counted by the frame frequency counting unit 21 is input to the slope positive/negative information output unit 22, the slope absolute value information output unit 23, and the switching control unit 25.

The slope positive/negative information output unit 22 includes a periodic burst mode positive/negative switching unit 22a, a continuous mode positive/negative switching unit 22b, a Steady-state mode positive/negative switching unit 22c, and a selector (SEL) 22d.

Figure 2:
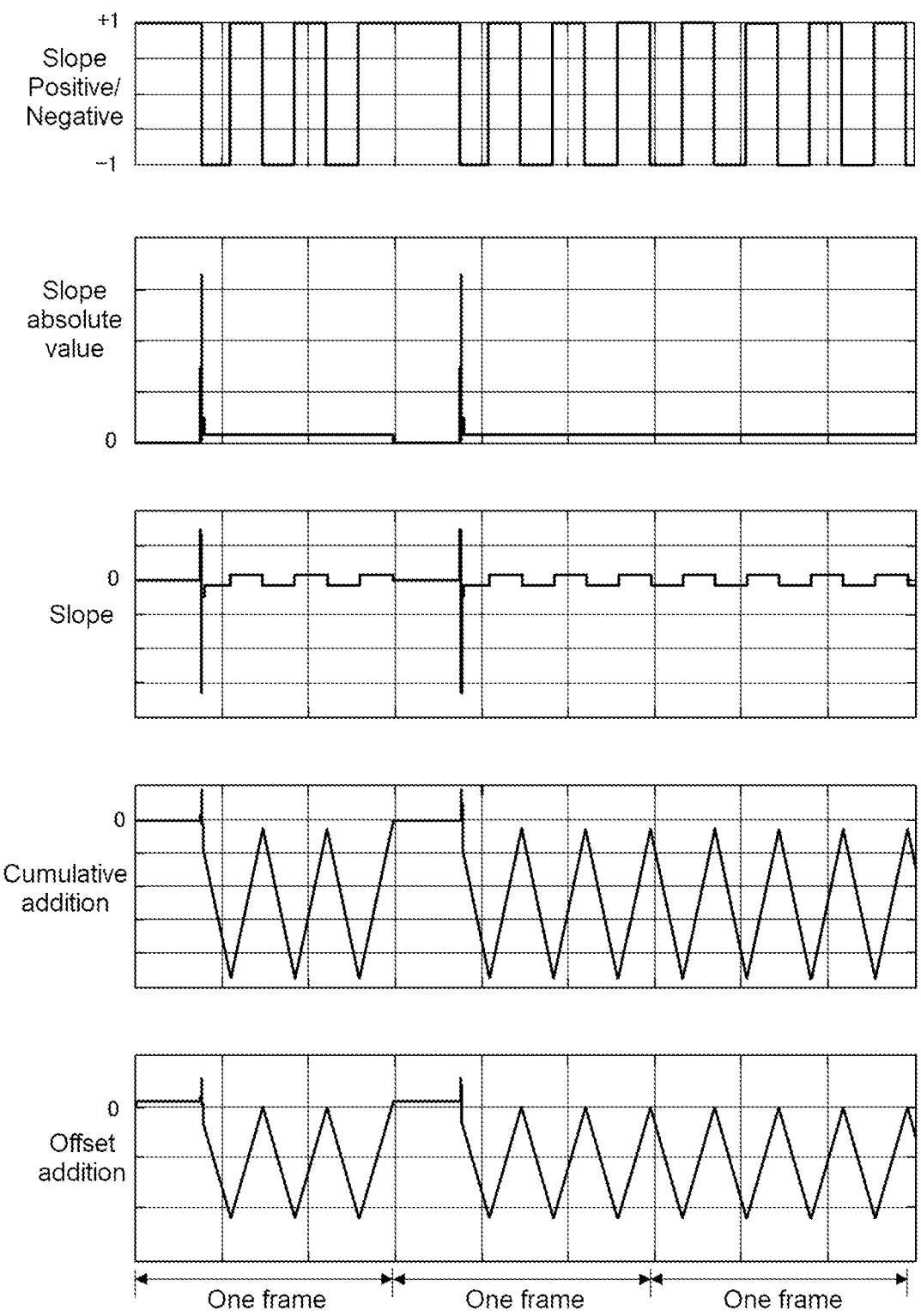
FIG. 2 is a graph illustrating slope positive/negative information, slope absolute value information, slope information, modulation signal before offset, and modulation signal after offset, which are generated by a modulation signal generator included in the SSC generator illustrated in FIG. 1.
Figure 17A:
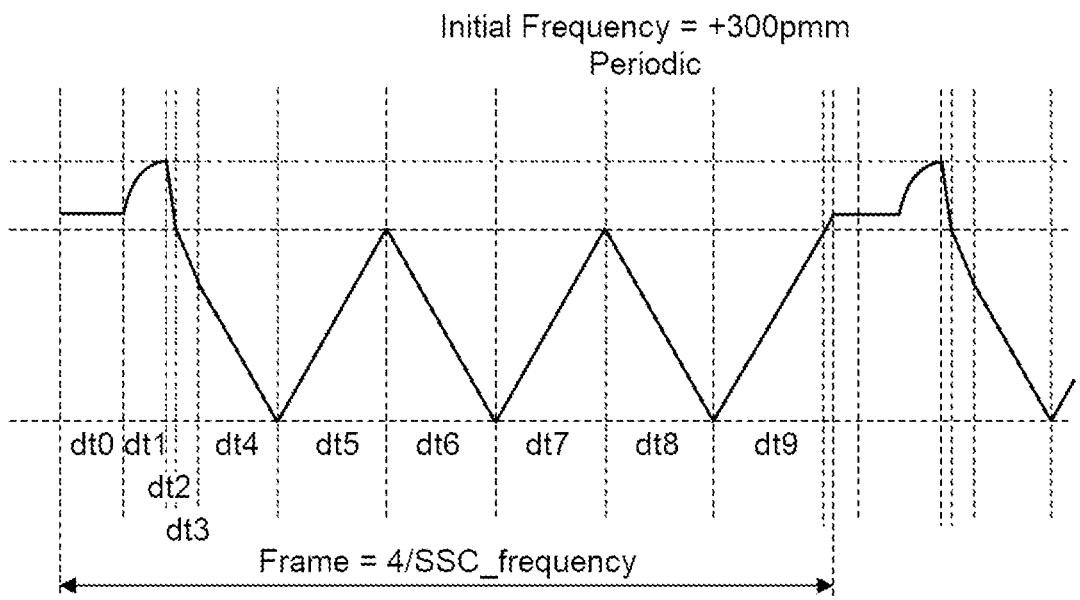
FIG. 17A is a graph illustrating a waveform pattern of a modulation signal for generating the SSC modulated signal in a state during training.

The periodic burst mode positive/negative switching unit 22a outputs slope positive/negative information consisting of a value of +1 or −1, which represents the positive/negative of the slope of the frequency shift of the waveform pattern in the periodic burst mode as illustrated in FIG. 17A. Specifically, the periodic burst mode positive/negative switching unit 22a outputs "+1" as the slope positive/negative information in the time section of the time widths dt0, dt1, dt5, dt7, and dt9 based on the count value from the frame frequency counting unit 21, and outputs "−1" as the slope positive/negative information in the time section of the time widths of dt2, dt3, dt4, dt6, and dt8. A first frame of a graph at a first stage in FIG. 2 illustrates an example of the slope positive/negative information in the periodic burst mode.

Figure 17B:
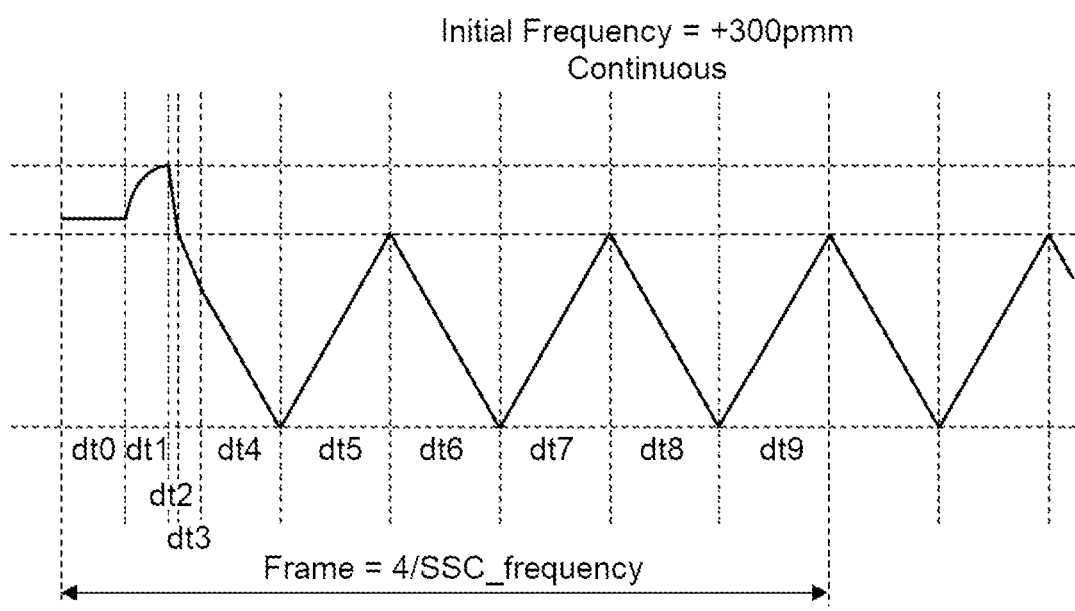
FIG. 17B is a graph illustrating a waveform pattern of a modulation signal for transitioning from the state during training to the Steady-state.

The continuous mode positive/negative switching unit 22b outputs the slope positive/negative information consisting of a value of +1 or −1, which represents the positive/negative of the slope of the frequency shift of the waveform pattern in the continuous mode as illustrated in FIG. 17B. Specifically, the continuous mode positive/negative switching unit 22b outputs "+1" as the slope positive/negative information in the time section of the time widths dt0, dt1, dt5, dt7, and dt9 based on the count value from the frame frequency counting unit 21, and outputs "−1" as the slope positive/negative information in the time section of the time widths of dt2, dt3, dt4, dt6, and dt8. A second frame of the graph at the first stage in FIG. 2 illustrates an example of the slope positive/negative information in the continuous mode.

Figure 16:
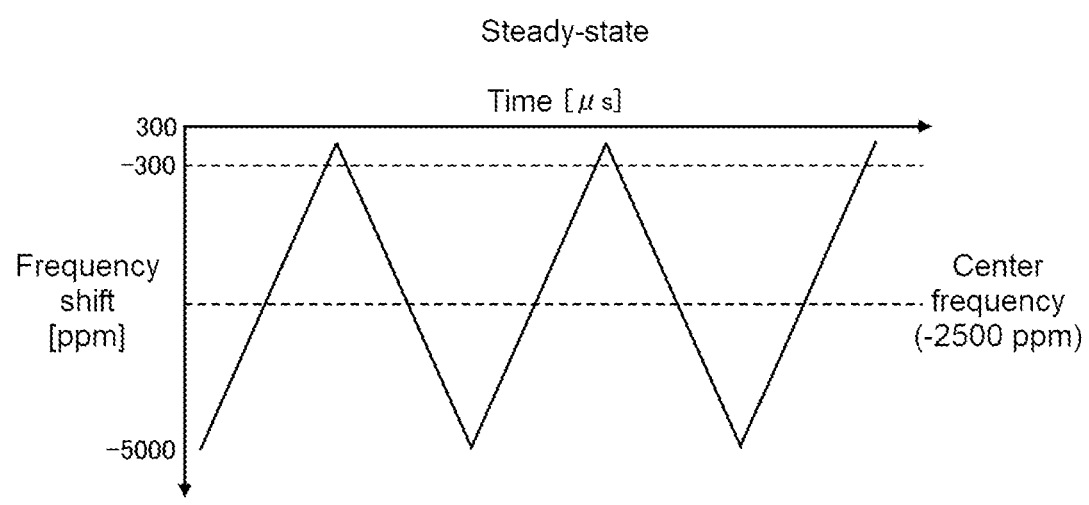
FIG. 16 is a graph illustrating a waveform pattern of a triangular wave for generating a down spread SSC modulated signal in a Steady-state.

The Steady-state mode positive/negative switching unit 22c outputs the slope positive/negative information consisting of a value of +1 or −1, which represents the positive/negative of the slope of the frequency shift of the waveform pattern in the Steady-state mode as illustrated in FIG. 16 for each ½ cycle of a triangular wave waveform of the modulation signal based on the count value from the frame frequency counting unit 21. A third frame of the graph at the first stage in FIG. 2 illustrates an example of the slope positive/negative information in the Steady-state mode.

The SEL 22d outputs the slope positive/negative information from the periodic burst mode positive/negative switching unit 22a to the multiplication unit 24 in the periodic burst mode, outputs the slope positive/negative information from the continuous mode positive/negative switching unit 22b to the multiplication unit 24 in the continuous mode, and outputs the slope positive/negative information from the Steady-state mode positive/negative switching unit 22c to the multiplication unit 24 in the Steady-state mode.

The slope absolute value information output unit 23 includes a periodic burst mode slope switching unit 23a, a continuous mode slope switching unit 23b, a Steady-state mode slope switching unit 23c, and a selector (SEL) 23d.

The periodic burst mode slope switching unit 23a outputs information (hereinafter, also referred to as "slope absolute value information") on the absolute value of the slope of the frequency shift of the waveform pattern in the periodic burst mode as illustrated in FIG. 17A based on the count value from the frame frequency counting unit 21. The slope absolute value information output from the periodic burst mode slope switching unit 23a is determined according to the modulation frequency specified by the operation input to the operation unit 40 by the user and the frequency shift for each arbitrary time section. A first frame of a graph at a second stage in FIG. 2 illustrates an example of the slope absolute value information in the periodic burst mode. The slope absolute value information in the periodic burst mode corresponds to a value obtained by integrating the slope of the frequency shift in the periodic burst mode over a predetermined clock period Tclk.

The continuous mode slope switching unit 23b outputs the slope absolute value information of the frequency shift of the waveform pattern in the continuous mode as illustrated in FIG. 17B based on the count value from the frame frequency counting unit 21. The slope absolute value information output from the continuous mode slope switching unit 23b is determined according to the modulation frequency specified by the operation input to the operation unit 40 by the user and the frequency shift for each arbitrary time section. A second frame of the graph at the second stage in FIG. 2 illustrates an example of the slope absolute value information in the continuous mode. The slope absolute value information in the continuous mode corresponds to a value obtained by integrating the slope of the frequency shift in the continuous mode over the predetermined clock period Tclk.

The Steady-state mode slope switching unit 23c outputs the slope absolute value information of the frequency shift of the waveform pattern in the Steady-state mode as illustrated in FIG. 16 based on the count value from the frame frequency counting unit 21. The slope absolute value information output from the Steady-state mode slope switching unit 23c is determined according to the modulation frequency specified by the operation input to the operation unit 40 by the user and the frequency shift for each arbitrary time section. A third frame of the graph at the second stage in FIG. 2 illustrates an example of the slope absolute value information in the Steady-state mode. The slope absolute value information in the Steady-state mode corresponds to a value obtained by integrating the slope of the frequency shift in the Steady-state mode over the predetermined clock period Tclk.

The SEL 23d outputs the slope absolute value information from the periodic burst mode slope switching unit 23a to the multiplication unit 24 in the periodic burst mode, outputs the slope absolute value information from the continuous mode slope switching unit 23b to the multiplication unit 24 in the continuous mode, and outputs the slope absolute value information from the Steady-state mode slope switching unit 23c to the multiplication unit 24 in the Steady-state mode.

The switching control unit 25 is input with a switching control signal including a switching instruction for switching the periodic burst mode to the Steady-state mode via the continuous mode, and outputs the switching timing control signal for controlling the switching timing to the SEL 22d and the SEL 23d. Hereinafter, the waveform pattern in the periodic burst mode is also referred to as a "first pattern", the waveform pattern in the continuous mode is referred to as a "second pattern", and the waveform pattern in the Steady-state mode is also referred to as a "third pattern". Here, the switching instruction indicates, for example, a fact that a link state management mechanism provided in the DUT has transitioned from a state during training to the Steady-state, and is input to the switching control unit 25 from the outside of the SSC generator 1. Alternatively, the switching instruction may be given to the switching control unit 25 at an arbitrary timing by an operation input to the modulation selection unit 67 on the setting screen 60 which will be described later.

The multiplication unit 24 outputs a value obtained by multiplying the slope positive/negative information output from the slope positive/negative information output unit 22 and the slope absolute value information output from the slope absolute value information output unit 23, that is, information on the slope of the frequency shift of the waveform of the modulation signal (hereinafter, also referred to as "slope information").

The cumulative addition unit 26 generates the modulation signal by cumulatively adding the slope information of the modulation signal output from the multiplication unit 24 for each predetermined clock period Tclk.

The offset addition unit 27 outputs a desired modulation signal by offsetting the entire modulation signal generated by the cumulative addition unit 26 as necessary. For example, the offset addition unit 27 offsets the entire modulation signal by the amount of the frequency shift in the 0-th section of the time width dt0.

The operation unit 40 illustrated in FIG. 1 is for receiving an operation input by the user, and is configured with, for example, a touch panel including a touch sensor for detecting a contact position by a contact operation with the input surface corresponding to the display screen of the display unit 41. When the user touches the position of a specific item displayed on the display screen with a finger, a stylus, or the like, the operation unit 40 recognizes the match between the position detected by the touch sensor on the display screen and the position of the item, and outputs a signal for executing the function assigned to each item to the modulation control unit 42. The operation unit 40 may be operably displayed on the display unit 41, or may be configured to include an input device such as a keyboard or a mouse.

Further, with the operation input to the operation unit 40 by the user, it is possible to set the selection of a spread method, a modulation frequency, the reference frequency Fc of the reference signal output from the reference signal generation source 10, the frequency shift (ratio of modulation to the reference frequency Fc) for each arbitrary time section, and the like, as setting information necessary for generating an SSC modulated signal having spread spectrum according to a desired standard. Further, it is also possible to output the switching instruction for switching from the periodic burst mode to the Steady-state mode via the continuous mode to the switching control unit 25 from the modulation control unit 42 by the operation input to the operation unit 40 by the user.

The display unit 41 is configured with display equipment such as a liquid crystal display or a CRT, and displays operation targets such as a setting item screen related to the SSC generator 1 including a setting screen 60 which will be described later, and buttons, soft keys, pull-down menus, and text boxes for setting various conditions on the setting item screen, based on the display control by the modulation control unit 42.

Further, as illustrated in FIGS. 3 to 7, the display unit 41 displays the setting screen 60 for setting parameters for determining the waveform of the modulation signal. Here, the operation unit 40 accepts the operation input with respect to the setting screen 60.

Figure 3:
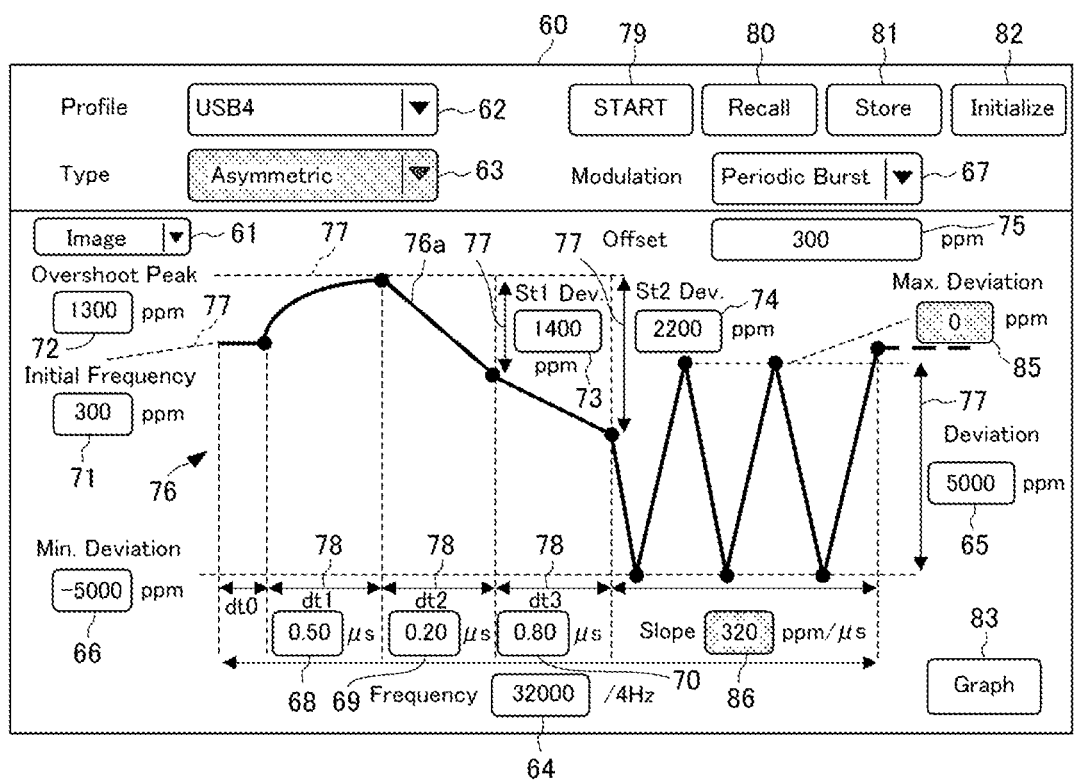
FIG. 3 is a diagram illustrating a display example in an image format of a setting screen in a periodic burst mode (USB4) in the SSC generator illustrated in FIG. 1.
Figure 4:
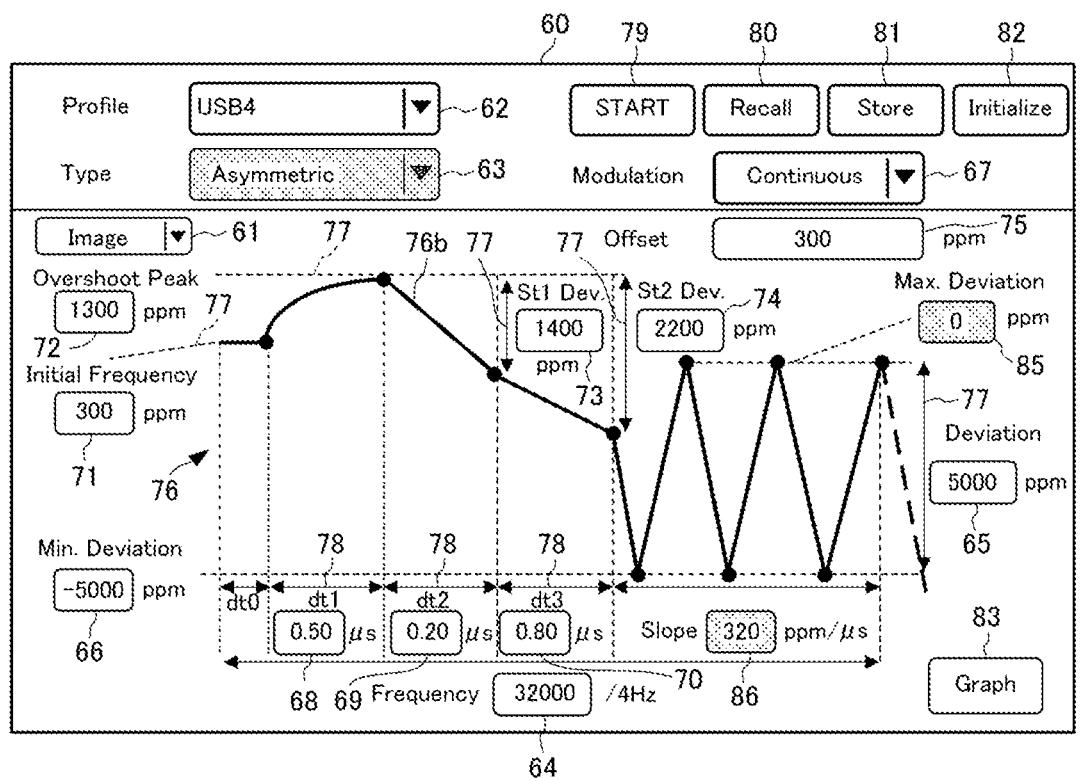
FIG. 4 is a diagram illustrating a display example in an image format of a setting screen in a continuous mode (USB4) in the SSC generator illustrated in FIG. 1.
Figure 5:
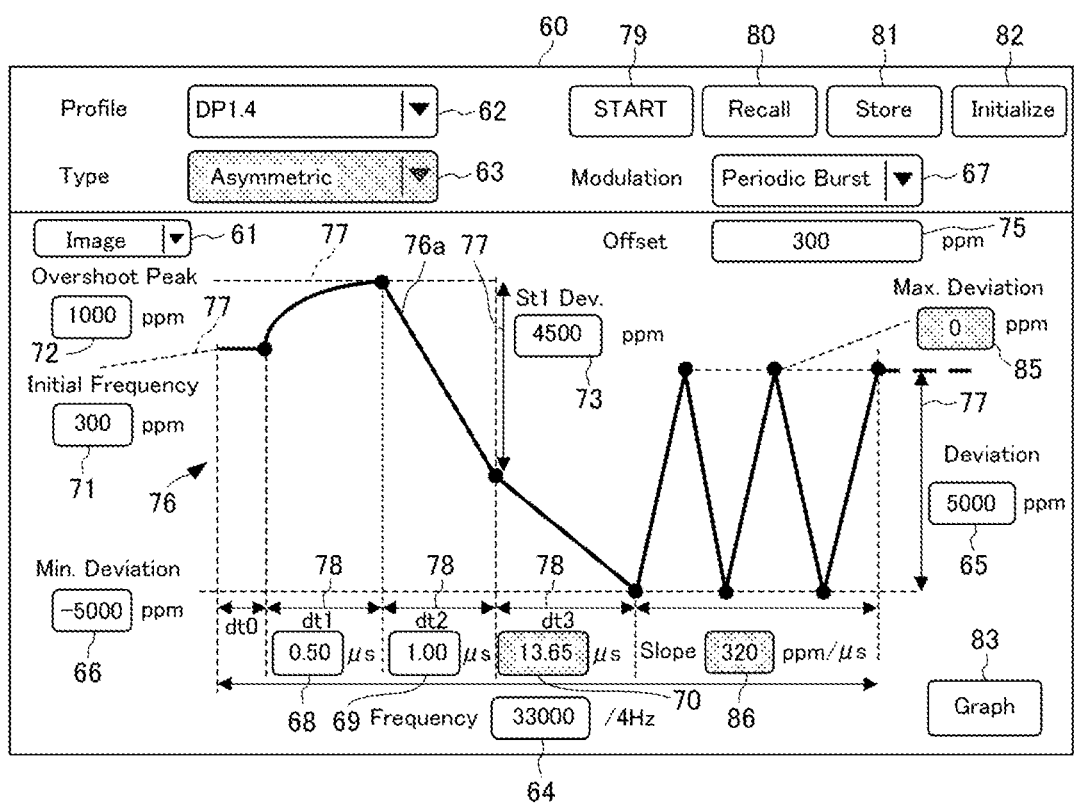
FIG. 5 is a diagram illustrating a display example in an image format of a setting screen in a periodic burst mode (DP1.4) in the SSC generator illustrated in FIG. 1.
Figure 6:
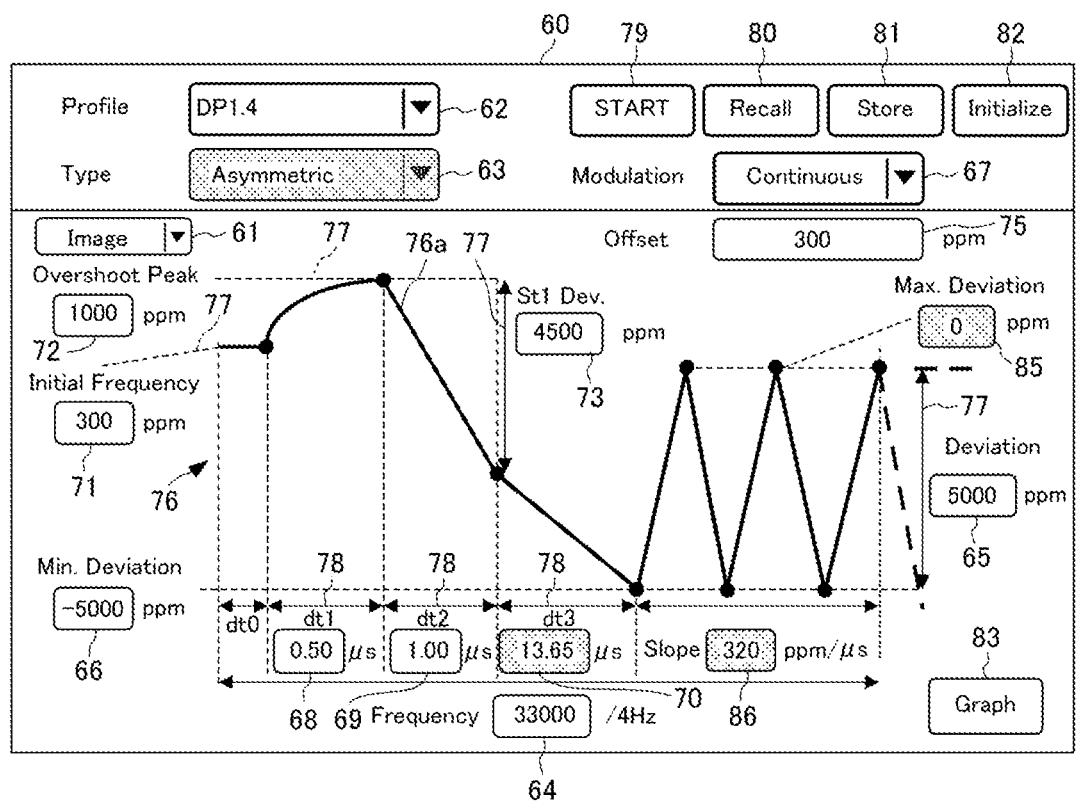
FIG. 6 is a diagram illustrating a display example in an image format of a setting screen in a continuous mode (DP1.4) in the SSC generator illustrated in FIG. 1.

FIGS. 3 and 4 illustrate an example of the setting screen 60 for setting various parameters for determining the waveform of the modulation signal for USB4, and FIGS. 5 and 6 illustrate an example of the setting screen 60 for setting various parameters for determining the waveform of the modulation signal for DP1.4. The setting screen 60 includes a display format selection unit 61, a waveform selection unit 62, a spread method selection unit 63, a modulation frequency input unit 64, a frequency shift amplitude input unit 65, a minimum frequency shift input unit 66, a modulation selection unit 67, a first section input unit 68, a second section input unit 69, a third section input unit 70, a 0-th frequency shift input unit 71, a first frequency shift input unit 72, a second frequency shift input unit 73, a third frequency shift input unit 74, an offset input unit 75, a waveform image display area 76, a frequency shift settable location display unit 77, a time width settable location display unit 78, an SSC modulation button 79, a waveform parameter read button 80, a waveform parameter save button 81, a waveform parameter initialization button 82, and a graph display button 83. The setting screen 60 for DP1.4 does not include the third frequency shift input unit 74.

The display format selection unit 61 is configured as a pull-down menu for selecting whether to select a display format for setting various parameters for determining the waveform of the modulation signal as an image format "Image" as illustrated in FIGS. 3 to 6 or a list format "List" as illustrates in FIG. 7.

For example, the waveform selection unit 62 is configured as a pull-down menu for switching a waveform "Triangular" of the triangular wave modulation signal, a waveform "USB4" of the modulation signal for USB4, and a waveform "DP1.4" of the modulation signal for DP1.4. FIGS. 3, 4, and 7 illustrate a state in which the waveform of the modulation signal for USB4 is selected in the waveform selection unit 62, and FIGS. 5 and 6 illustrate a state in which the waveform of the modulation signal for DP1.4 is selected in the waveform selection unit 62.

The spread method selection unit 63 is configured as a pull-down menu for selecting a spread method from down spread, center spread, and upper spread in a case where "Triangular" is selected in the waveform selection unit 62. On the other hand, in a case where "USB4" or "DP1.4" is selected in the waveform selection unit 62, the spread method selection unit 63 displays "Asymmetric" as immutable.

The modulation frequency input unit 64 is configured as a text box for setting the modulation frequency of the waveform of the modulation signal. For example, according to the requirement of the USB4 standard, the modulation frequency value includes 32 kHz and 36 kHz. However, the modulation frequency input unit 64 can set the modulation frequency in a range of, for example, 28 to 37 kHz regardless of a selection result of the waveform selection unit 62. The "modulation frequency" refers to the frequency of the waveform portion of the triangular wave in the modulation signal, and the frequency of the frame of the waveform pattern in the periodic burst mode or the continuous mode is a value of ¼ of the modulation frequency.

The frequency shift amplitude input unit 65 is configured as a text box for setting a frequency shift amplitude "SSC_Deviation" of the waveform portion of the triangular wave of the modulation signal. For example, according to the requirements of the USB4 standard, the value of SSC_Deviation includes 5000 ppm, 5600 ppm, and 5800 ppm. However, the frequency shift amplitude input unit 65 can set an arbitrary value, for example, in a range of 0 to 7000 ppm regardless of the selection result of the waveform selection unit 62.

The minimum frequency shift input unit 66 is configured as a text box for setting the minimum value "Minimum_SSC_Deviation" of the frequency shift of the waveform of the modulation signal. For example, according to the requirements of the USB4 standard, a value of the Minimum_SSC_Deviation includes −5000 ppm, −4700 ppm, −5300 ppm, and −5600 ppm. However, the minimum frequency shift input unit 66 can set an arbitrary value, for example, in a range from −7000 ppm to any smaller one of "Overshoot_Peak-Step2" ppm and "Initial_Frequency" ppm, which will be described later, regardless of the selection result of the waveform selection unit 62.

The modulation selection unit 67 constitutes a pattern switching input unit for switching the waveform pattern of the modulation signal generated by the modulation signal generator 20 from the first pattern to the second pattern. The modulation selection unit 67 is configured as a pull-down menu for switching between the periodic burst mode and the continuous mode. The display of "Periodic Burst" in the modulation selection unit 67 indicates the periodic burst mode, and the display of "Continuous" in the modulation selection unit 67 indicates the continuous mode. In a case where "USB4" or "DP1.4" is selected in the waveform selection unit 62, the display of the modulation selection unit 67 is switched from "Periodic Burst" to "Continuous" by the operation unit 40, so that it is possible to perform seamless change from the periodic burst mode to the continuous mode. Even when the modulation selection unit 67 switches between the periodic burst mode and the continuous mode, the other various parameters displayed on the setting screen 60 are not changed.

In a case where "USB4" is selected in the waveform selection unit 62, the first section input unit 68, the second section input unit 69, and the third section input unit 70 constitute a time width input unit for setting time widths dt1, dt2, and dt3 of a plurality of time sections. On the other hand, in a case where "DP1.4" is selected in the waveform selection unit 62, the first section input unit 68 and the second section input unit 69 constitute a time width input unit for setting time widths dt1 and Dt2 of the plurality of time sections.

The first section input unit 68 is configured as a text box for setting the time width dt1 of a first section in which the slope of the frequency shift of the waveform of the modulation signal is non-linear. According to the requirements of the USB4 standard, the value of dt1 is 0.5 μs. However, the first section input unit 68 can set an arbitrary value, for example, in a range of 0.1 to 1.5 μs regardless of the selection result of the waveform selection unit 62.

The second section input unit 69 is configured as a text box for setting the time width dt2 of a second section in which the slope of the frequency shift of the waveform of the modulation signal is linear. According to the requirements of the USB4 standard, the value of dt2 is 0.2 μs, and, according to the requirements of the DP1.4 standard, and the value of dt2 is 1.0 μs. However, the second section input unit 69 can set an arbitrary value, for example, in the range of 0.1 to 1.5 μs regardless of the selection result of the waveform selection unit 62.

In a case where "USB4" is selected in the waveform selection unit 62, the third section input unit 70 is constituted as a text box for setting the time width dt3 of the third section in which the slope of the frequency shift of the waveform of the modulation signal is linear. According to the requirements of the USB4 standard, the value of dt3 is 0.8 μs. However, the third section input unit 70 can set an arbitrary value, for example, in the range of 0.1 to 1.5 μs. On the other hand, the third section input unit 70 is constituted as a text box for displaying that the time width dt3 is immutable in a case where "DP1.4" is selected in the waveform selection unit 62. The value of dt3 is dt5−dt1−dt2 according to the requirements of the DP1.4 standard. A method of calculating the time width dt5 in a fifth section will be described later.

In a case where "USB4" is selected in the waveform selection unit 62, the 0-th frequency shift input unit 71, the first frequency shift input unit 72, the second frequency shift input unit 73, and the third frequency shift input unit 74 constitute a frequency shift input unit for arbitrarily setting the frequency shift of the waveform of the modulation signal in the plurality of time sections. On the other hand, in a case where "DP1.4" is selected in the waveform selection unit 62, the 0-th frequency shift input unit 71, the first frequency shift input unit 72, and the second frequency shift input unit 73 constitute a frequency shift input unit for arbitrarily setting the frequency shift of the waveform of the modulation signal in the plurality of time sections.

The 0-th frequency shift input unit 71 is configured as a text box for setting the frequency shift "Initial_Frequency" of the waveform of the modulation signal from the reference frequency Fc in the 0-th section. Here, "Initial_Frequency" represents the frequency shift of the waveform of the modulation signal from the reference frequency Fc in the 0-th section of the plurality of time sections. For example, according to the requirements of the USB4 standard, a value of "Initial_Frequency" includes +300 ppm, 0 ppm, and −300 ppm. However, the 0-th frequency shift input unit 71 can set an arbitrary value, for example, in a range of −1000 to 1000 ppm as the "Initial_Frequency" regardless of the selection result of the waveform selection unit 62.

The first frequency shift input unit 72 is configured as a text box for setting the frequency shift "Overshoot_Peak" of the waveform of the modulation signal from the reference frequency Fc at the end of the first section of the plurality of time sections. According to the requirements of the USB4 standard, a value of "Overshoot_Peak" is 1300 ppm. However, the first frequency shift input unit 72 can set an arbitrary value, for example, in a range of "Initial_Frequency" to "SSC_Deviation" as "Overshoot_Peak" regardless of the selection result of the waveform selection unit 62.

The second frequency shift input unit 73 is configured as a text box for setting the frequency shift "Step1" of the waveform of the modulation signal in the second section of the plurality of time sections. According to the requirements of the USB4 standard, a value of "Step1" is 1400 ppm. However, the second frequency shift input unit 73 can set, for example, an arbitrary value from 0 to "Step2", which will be described later, as "Step1". In a case where "DP1.4" is selected in the waveform selection unit 62, the second frequency shift input unit 73 can set, for example, an arbitrary value in the range of 0 to "Overshoot_Peak-Minimum_SSC_Deviation" as "Step1".

In a case where "USB4" is selected in the waveform selection unit 62, the third frequency shift input unit 74 is configured as a text box for setting a frequency shift "Step2" of the waveform of the modulation signal in the third section of the plurality of time sections. According to the requirements of the USB4 standard, the value of "Step2" is 2200 ppm. However, the third frequency shift input unit 74 can set an arbitrary value, for example, in the range from "Step1" to "Minimum_SSC_Deviation" as "Step2". In a case where "DP1.4" is selected in the waveform selection unit 62, the third frequency shift input unit 74 is not displayed.

The offset input unit 75 is configured as a text box for setting an offset "Offset" of the entire waveform of the modulation signal. According to the requirements of the USB4 and DP1.4 standards, the value of "Offset" is 0 ppm.

However, the offset input unit 75 can set an arbitrary value, for example, in the range of −1000 to 1000 ppm as "Offset".

The waveform image display area 76 is an area for displaying schematic waveform images 76a and 76b of the modulation signal. When triggered by a fact that the display of the modulation selection unit 67 is switched from "Periodic Burst" to "Continuous" by the operation input to the modulation selection unit 67 by the operation unit 40, the waveform image display area 76 performs display after switching the schematic waveform image 76a of the first pattern to the schematic waveform image 76b of the second pattern.

The frequency shift settable location display unit 77 schematically indicates a location where the frequency shift can be set in the waveform of the modulation signal in association with the waveform images 76a and 76b displayed in the waveform image display area 76.

The time width settable location display unit 78 schematically indicates a location where the time widths of the plurality of time sections can be set in the waveform of the modulation signal in association with the waveform images 76a and 76b displayed in the waveform image display area 76.

The frequency shift amplitude input unit 65, the 0-th frequency shift input unit 71, the first frequency shift input unit 72, the second frequency shift input unit 73, and the third frequency shift input unit 74 are disposed in the vicinity of the frequency shift settable location display unit 77, respectively. Further, the first section input unit 68, the second section input unit 69, and the third section input unit 70 are disposed in the vicinity of the time width settable location display unit 78, respectively.

The SSC modulation button 79 is configured as a button for instructing start or stop of generation of the waveform of the modulation signal by the modulation signal generator 20. The display of "START" in the SSC modulation button 79 indicates a state in which the generation of the waveform of the modulation signal has not started. When the SSC modulation button 79 in a state of being displayed with "START" is pressed by the operation unit 40, the generation of the waveform of the modulation signal is started. At this time, the display of "START" in the SSC modulation button 79 is switched to "STOP". On the other hand, when the SSC modulation button 79 in the state of being displayed with "STOP" is pressed by the operation unit 40, the generation of the waveform of the modulation signal is stopped, and the state returns to a state in which the SSC modulation is not performed on the reference signal output from the reference signal generation source 10.

The waveform parameter read button 80 is configured as a button for reading various parameters saved in the modulation control unit 42 and displaying the read various parameters on each unit of the setting screen 60 when pressed by the operation unit 40.

The waveform parameter save button 81 is configured as a button for saving the various parameters currently displayed on the setting screen 60 in the modulation control unit 42 when pressed by the operation unit 40.

The waveform parameter initialization button 82 is configured as a button for erasing the various parameters currently displayed on the setting screen 60 and displaying initial setting values of the various parameters saved in the modulation control unit 42 when pressed by the operation unit 40.

The graph display button 83 is configured as a button for displaying a waveform display screen 90, which will be described later, on the display unit 41 when pressed by the operation unit 40.

FIG. 7 illustrates an example of the setting screen 60 displayed in a list format in a case where "List" is selected in the display format selection unit 61. Here, items different from display items in the image format illustrated in FIGS. 3 and 4 will be mainly described. The setting screen 60 includes a list 84 for setting the various parameters that determine the waveform of the modulation signal.

As illustrated in FIG. 7, the list 84 displays the shape "Shape" of the waveform of the modulation signal, the frequency shift "δ Deviation" of the waveform of the modulation signal, the time width "Time" of each time section, and the absolute value "Slope" of the slope of the frequency shift of the waveform of the modulation signal for each time section.

The item of "Shape" related to the 0-th section of the time width dt0 displays "Flat" indicating that the frequency shift in the 0-th section is 0 ppm as immutable.

The item of "Shape" related to the first section of the time width dt1 to the third section of the time width dt3 is capable of setting any of, for example, "Flat" indicating that the frequency shift in each time section is 0 ppm, "Curved" indicating that the frequency shift in each time section changes in a curved line with the passage of time, and "Linear" indicating that the frequency shift in each time section changes linearly with the passage of time.

The item of "Shape" related to a time section "Main" from the fourth section of the time width dt4 to the ninth section of the time width dt9 displays "Linear" indicating that the frequency shift in each time section changes linearly with the passage of time, as immutable.

The item of "δ Deviation" related to the 0-th section displays 0 ppm as immutable regardless of the value of "Initial_Frequency" input to the 0-th frequency shift input unit 71.

The item of "δ Deviation" related to the first section can set the frequency shift of the first section based on the frequency shift at the end of the 0-th section, that is, the frequency shift corresponding to a value obtained by subtracting the "Initial_Frequency" set by the 0-th frequency shift input unit 71 from the "Overshoot_Peak" set by the first frequency shift input unit 72 in the image format.

The item of "δ Deviation" related to the second section can set the frequency shift of the second section based on the frequency shift at the end of the first section, that is, the frequency shift corresponding to the value of "Step1" set by the second frequency shift input unit 73 in the image format.

The item of "δ Deviation" related to the third section can set the frequency shift of the third section based on the frequency shift at the end of the second section in a case where "USB4" is selected in the waveform selection unit 62, that is, the frequency shift corresponding to a value obtained by subtracting "Step2" set by the third frequency shift input unit 74 from "Step1" set by the second frequency shift input unit 73 in the image format. On the other hand, in a case where "DP1.4" is selected in the waveform selection unit 62, the item of "δ Deviation" related to the third section displays the frequency shift corresponding to "Step1−Overshoot_Peak+Minimum_SSC_Deviation" as immutable.

The item of "δ Deviation" related to the time section "Main" from the fourth section to the ninth section displays "SSC_Deviation" input to the frequency shift amplitude input unit 65 as immutable.

The item of "Time" related to the 0-th section displays the time width dt0 of the 0-th section calculated by the time width calculation unit 42*a*, which will be described later, as immutable.

The item of "Time" related to the first section corresponds to the first section input unit 68 in the image format, and the time width dt1 of the first section can be set.

The item of "Time" related to the second section corresponds to the second section input unit 69 in the image format, and the time width dt2 of the second section can be set.

The item of "Time" related to the third section corresponds to the third section input unit 70 in the image format, and, in a case where "USB4" is selected in the waveform selection unit 62, the time width dt3 of the third section can be set. On the other hand, in a case where "DP1.4" is selected in the waveform selection unit 62, the item of "Time" related to the third section displays the time width dt3 calculated by the time width calculation unit 42*a*, which will be described later, as immutable.

The item of "Time" related to the time section "Main" from the fourth section to the ninth section displays the time width calculated by the time width calculation unit 42*a*, which will be described later, as immutable.

The "Slope" item related to the 0-th section, the second section, the third section, and the time section "Main" displays an absolute value of the slope of the frequency shift of the waveform of the modulation signal calculated by a slope absolute value calculation unit 42*b*, which will be described later, as immutable.

In this way, in a case where "List" is selected in the display format selection unit 61, the first frequency shift input unit 72, the second frequency shift input unit 73, the third frequency shift input unit 74, the first section input unit 68, the second section input unit 69, the third section input unit 70, and the absolute value of the slope are displayed on the setting screen 60 in a list format.

Figure 8:
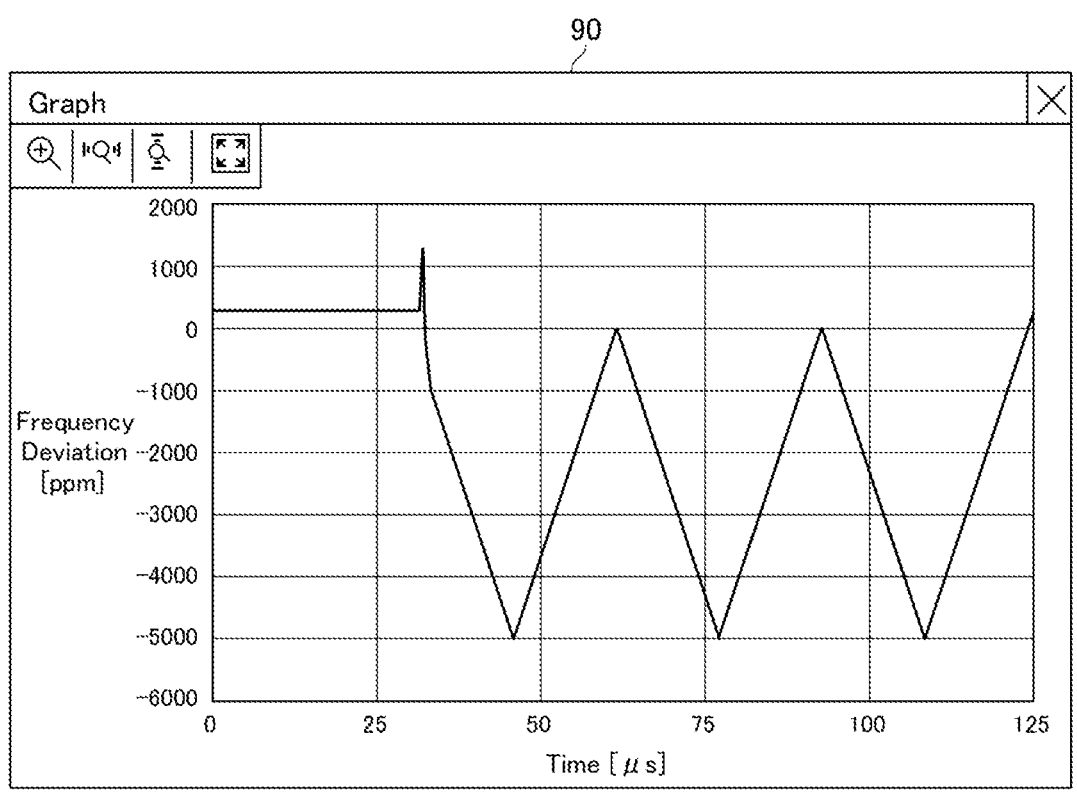
FIG. 8 is a diagram illustrating a display example of a waveform display screen of the SSC generator illustrated in FIG. 1.

The waveform display screen 90 illustrated in FIG. 8 displays a graph of the waveform of the modulation signal based on the various parameters determined in response to the operation input with respect to the setting screen 60. Further, when the various parameters are changed on the setting screen 60, the waveform display screen 90 performs display after updating a graph of the waveform of the modulation signal in real time each time. With the waveform display screen 90 configured as above, it is possible to cause the user to intuitively grasp the waveform of the modulation signal generated based on the various parameters. In a case where "Periodic Burst" is selected by the modulation selection unit 67, the waveform display screen 90 displays a graph of the waveform of the modulation signal in the periodic burst mode, as illustrated in FIG. 8. On the other hand, in a case where "Continuous" is selected by the modulation selection unit 67, the waveform display screen 90 displays a graph of the waveform of the modulation signal in the continuous mode.

The modulation control unit 42 is constituted by, for example, a microcomputer or a personal computer including a Central Processing Unit (CPU), a Read Only Memory (ROM), a Random Access Memory (RAM), a Hard Disk Drive (HDD), and the like, and controls the operation of each of the above-described units configuring the SSC generator 1. Further, the modulation control unit 42 can constitute at least a part of the modulation signal generator 20 by software by transferring a predetermined program stored in the ROM or the like to the RAM and executing the program by the CPU. At least a part of the modulation signal generator 20 can be constituted by a digital circuit such as a Field Programmable Gate Array (FPGA) or an Application Specific Integrated Circuit (ASIC). Alternatively, at least a part of the modulation signal generator 20 can be constituted by appropriately combining a hardware process by a digital circuit and a software process by the predetermined program.

The modulation control unit 42 illustrated in FIG. 1 controls the waveform of the modulation signal in response to the operation input with respect to the setting screen 60. For example, when triggered by the operation input to the modulation selection unit 67 by the operation unit 40, the modulation control unit 42 switches the waveform pattern of the modulation signal, which is output from the modulation signal generator 20, from the first pattern to the second pattern. Further, the modulation control unit 42 includes a time width calculation unit 42*a* and the slope absolute value calculation unit 42*b*. Further, the modulation control unit 42 controls the operation of each of the above-described units constituting the modulation signal generator 20.

In a case where "USB4" is selected in the waveform selection unit 62, the time width calculation unit 42*a* calculates the remaining time widths dt0, dt4, dt5, and dt9 of the time sections which are not set by the first section input unit 68, the second section input unit 69, and the third section input unit 70, based on the modulation frequency set by the modulation frequency input unit 64 and the time widths dt1, dt2, and dt3 which are set by the first section input unit 68, the second section input unit 69, and the third section input unit 70. Note that, dt6, dt7, and dt8 are equal to dt5. On the other hand, in a case where "DP1.4" is selected in the waveform selection unit 62, the time width calculation unit 42*a* calculates the remaining time widths dt0, dt3, dt4, dt5, and dt9 of the time sections which are not set by the first section input unit 68 and the second section input unit 69 based on the modulation frequency set by the modulation frequency input unit 64 and the time widths dt1 and dt2 which are set by the first section input unit 68, the second section input unit 69.

dt1 is a value (for example, 0.5 μs) set by the first section input unit 68. dt2 is a value (for example, 0.2 μs) set by the second section input unit 69. dt3 is a value (for example, 0.8 μs) set by the third section input unit 70 in a case where "USB4" is selected in the waveform selection unit 62. On the other hand, in a case where "DP1.4" is selected in the waveform selection unit 62, dt3 is calculated by the following Equation (1) using dt5 calculated by Equation (3) which will be described later.

$$dt3 = dt5 - dt1 - dt2 \quad (1)$$

In a case where "USB4" is selected in the waveform selection unit 62, dt4 is calculated by the following Equation (2) using the frequency shift "Overshoot_Peak" at the end of the first section set by the first frequency shift input unit 72, the frequency shift "Step2" in the third section set by the third frequency shift input unit 74, the minimum value of the frequency shift "Minimum_SSC_deviation" set by the minimum frequency shift input unit 66, and "SSC_slope" calculated by Equation (6) which will be described later. On the other hand, in a case where "DP1.4" is selected in the waveform selection unit 62, dt4=0.

$$dt4 = \frac{\text{Overshoot\_Peak} - Step2 - \text{Minimum\_SSC\_deviation}}{\text{SCC\_slope}} \quad (2)$$

dt5 is calculated as expressed in the following Equation (3) using the modulation frequency "SSC_Frequency" set by the modulation frequency input unit 64.

$$dt5 = \frac{1}{SSC\_Frequency \times 2} \quad (3)$$

In a case where "USB4" is selected in the waveform selection unit 62, dt9 is calculated by the following Equation (4) using dt5 calculated by Equation (3), "Initial_Frequency" set by the 0-th frequency shift input unit 71, "Maximum_SSC_deviation" calculated by Equation (7), which will be described later, and "SSC_slope" calculated by Equation (6) which will be described later. On the other hand, in a case where "DP1.4" is selected in the waveform selection unit 62, dt9=dt5.

$$dt9 = dt5 + \frac{Initial\_Fequency - Maximum\_SSC\_deviation}{SSC\_slope} \quad (4)$$

As expressed in the following Equation (5), dt0 is obtained by subtracting the sum of the time widths from the first section to the ninth section from the time width of one frame of the modulation signal. The time width of the time section "Main" in the list 84 of FIG. 7 is given by dt4+dt5×4+dt9.

$$dt0 = \frac{4}{SSC\_Frequency} - (dt1 + dt2 + dt3 + dt4 + dt5 \times 4 + dt9) \quad (5)$$

The slope "SSC_slope" of the triangular wave from the fifth section to the ninth section is calculated by the following Equation (6) using the amplitude "SSC_Deviation" of the triangular wave set by the frequency shift amplitude input unit 65 and the modulation frequency "SSC_Frequency" set by the modulation frequency input unit 64. The value of "SSC_slope" is displayed as immutable in a text box indicated by reference numeral 86 on the setting screen 60 illustrated in FIGS. 3 to 6, and is also displayed as immutable in the item of "Slope" of "Main" in the list 84 of the setting screen 60 illustrated in FIG. 7.

$$SSC\_slope = SSC\_Deviation \times SSC\_Frequency \times 2 \quad (6)$$

The maximum value "Maximum_SSC_deviation" of the frequency shift of the triangular wave from the fifth section to the eighth section is calculated as expressed in the following Equation (7) as the sum of the minimum value "Minimum_SSC_deviation" of the frequency shift set by the minimum frequency shift input unit 66 and the amplitude "SSC_Deviation" of the triangular wave set by the frequency shift amplitude input unit 65. A value of "Maximum_SSC_deviation" is displayed as immutable in a text box indicated by reference numeral 85 in FIGS. 3 to 7.

$$Maximum\_SSC\_deviation = Minimum\_SSC\_deviation + SSC\_Deviation \quad (7)$$

In a case where "USB4" is selected in the waveform selection unit 62, the slope absolute value calculation unit 42b calculates the absolute value of the slope of the frequency shift of the waveform of the modulation signal for each time section using the frequency shift for each time section set by the 0-th frequency shift input unit 71, the first frequency shift input unit 72, the second frequency shift input unit 73, and the third frequency shift input unit 74, the time widths dt1, dt2, and dt3 for each time section set by the first section input unit 68, the second section input unit 69, and the third section input unit 70, and the time widths dt0, dt4, dt5, and dt9 calculated by the time width calculation unit 42a. On the other hand, in a case where "DP1.4" is selected in the waveform selection unit 62, the slope absolute value calculation unit 42b calculates the absolute value of the slope of the frequency shift of the waveform of the modulation signal for each time section using the frequency shift for each time section set by the 0-th frequency shift input unit 71, the first frequency shift input unit 72, and the second frequency shift input unit 73, the time widths dt1 and dt2 for each time section set by the first section input unit 68 and the second section input unit 69, and the time widths dt0, dt3, dt4, dt5, and dt9 calculated by the time width calculation unit 42a.

Figure 9A:
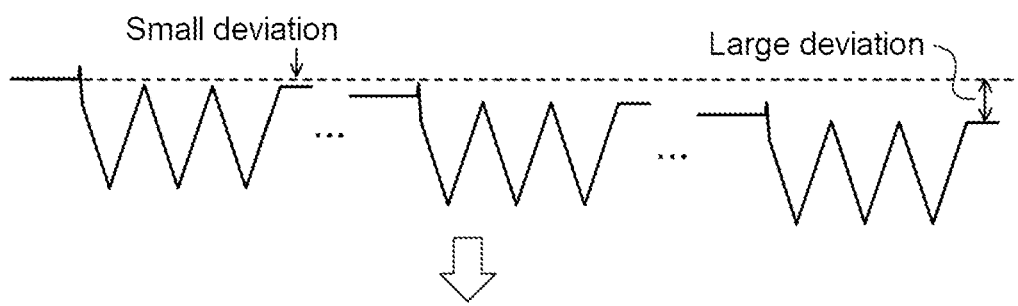
FIG. 9A is an explanatory diagram illustrating an output deviation for each frame in a cumulative addition unit according to the related art.
Figure 9B:
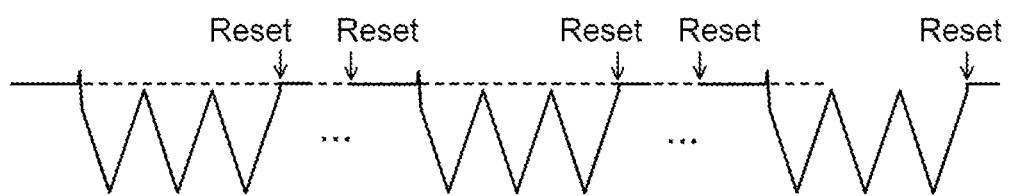
FIG. 9B is an explanatory diagram illustrating a correction process of an output deviation for each frame in a cumulative addition unit illustrated in FIG. 1.

Incidentally, in the cumulative addition unit 26, the output may not correctly return to an original value at the beginning (or at the end) of the frame of the waveform of the modulation signal, due to the resolution of the operation clock, the limitation of the number of usable bits, and the like. In such a case, as illustrated in FIG. 9A, there is a problem in that the deviation from the original value is integrated with the passage of time and the center frequency of the frequency shift changes. Therefore, as illustrated in FIG. 9B, the cumulative addition unit 26 resets the value of the waveform of the modulation signal for each frame to a predetermined value based on the count value of the frame frequency counting unit 21. For example, the cumulative addition unit 26 may reset the value at the beginning (or at the end) of the frame of the waveform of the modulation signal to the value of "Initial_Frequency" set by the 0-th frequency shift input unit 71.

The modulation unit 35 illustrated in FIG. 1 generates an SSC modulated signal by frequency-modulating the reference signal output from the reference signal generation source 10 using the modulation signal output from the offset addition unit 27 of the modulation signal generator 20, and is configured with an adder 35a.

The adder 35a outputs an SSC modulated signal whose frequency is spread spectrum by adding the reference signal input from the reference signal generation source 10 and the modulation signal input from the modulation signal generator 20.

Figure 10:
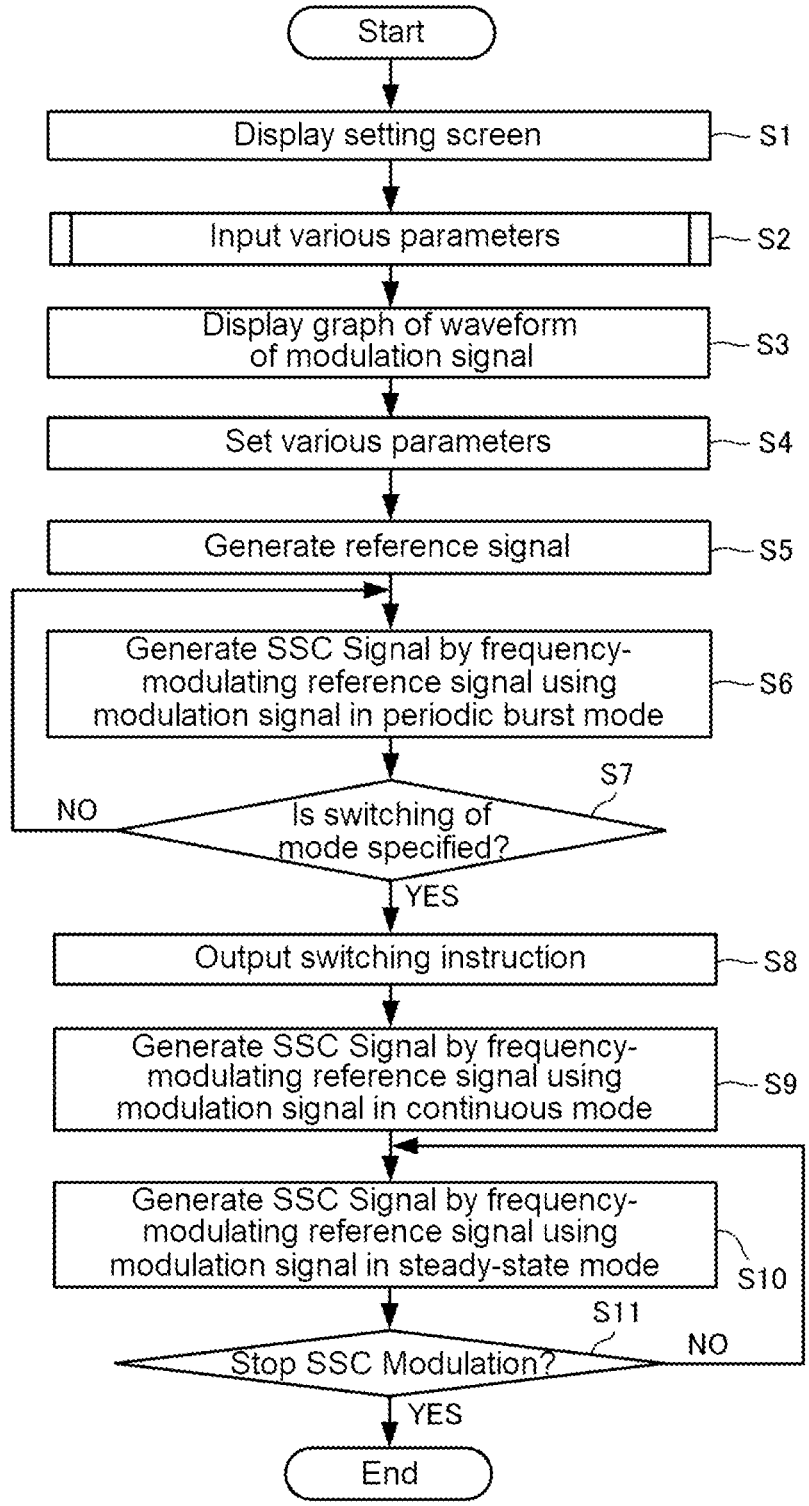
FIG. 10 is a flowchart illustrating a process of an SSC generation method using the SSC generator shown in FIG. 1.
Figure 11:
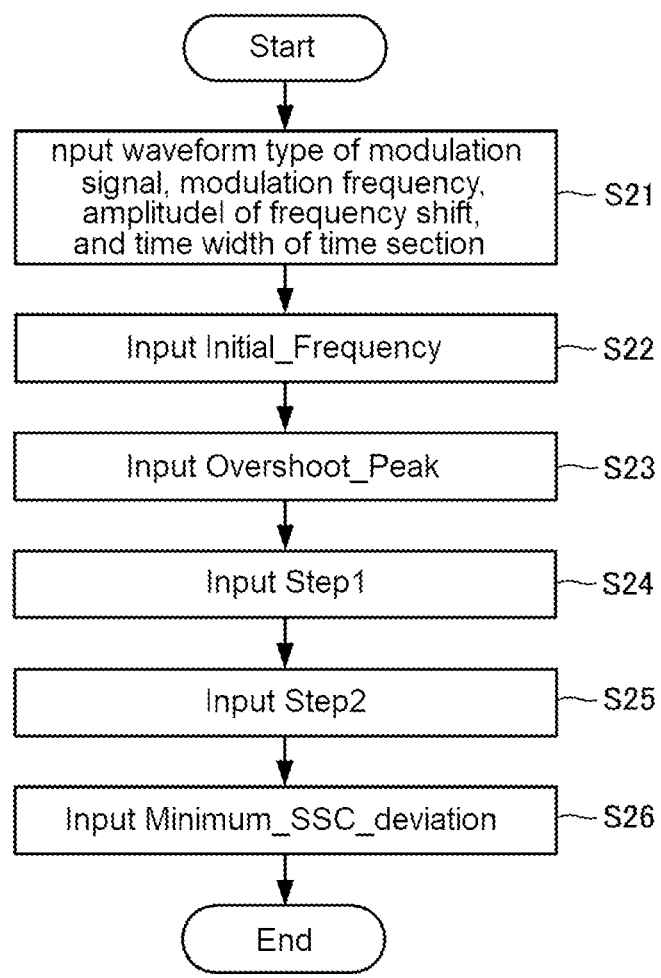
FIG. 11 is a flowchart illustrating details of a process in step S2 of the flowchart of FIG. 8.

Hereinafter, an example of the process of the spread spectrum clock generation method using the SSC generator 1 of the present embodiment will be described with reference to the flowchart of FIGS. 10 and 11. Hereinafter, a case where "USB4" is selected in the waveform selection unit 62 will be given as an example.

First, the display unit 41 displays the setting screen 60 for setting the parameters for determining the waveform of the modulation signal (display step S1).

Next, the operation unit 40 receives the operation input with respect to the setting screen 60 by the user (step S2). For example, the various parameters related to the SSC modulation are input by the operation input with respect to the setting screen 60. Further, by the operation input with respect to the display format selection unit 61 of the setting screen 60, whether the display format for setting the various parameters is the image format or the list format is selected. In a case where the graph display button 83 on the setting screen 60 is pressed by the operation unit 40, the display unit 41 displays the waveform display screen 90. Step S2, a pattern switching input step, which will be described later, and a frequency shift input step correspond to the operation step.

Next, in a case where the graph display button 83 of the setting screen 60 is pressed by the operation unit 40, the display unit 41 displays the waveform display screen 90 for performing display after updating the graph of the waveform of the modulation signal according to the operation input with respect to the setting screen 60 in step S2 (display step S3).

Next, the modulation control unit 42 sets the various parameters input by the user in step S2 in the reference signal generation source 10 and the modulation signal generator 20 (modulation control step S4). The modulation control step S4 is a step for controlling the waveform of the modulation signal generated by the process after step S6 in response to the operation input with respect to the setting screen 60.

Next, the reference signal generation source 10 generates the reference signal of the reference frequency Fc (reference signal generation step S5).

Next, when the SSC modulation button 79 in a state in which "START" is displayed is pressed by the operation unit 40, the modulation signal generator 20 generates the modulation signal in the periodic burst mode (modulation signal generation step). Next, the modulation unit 35 frequency-modulates the reference signal output from the reference signal generation source 10 using the modulation signal output from the modulation signal generator 20 in the periodic burst mode to generate a signal with SSC modulation (SSC modulated signal, modulation step S6).

Next, the modulation control unit 42 determines whether or not the pattern switching input step for performing specification of switching from the periodic burst mode to the continuous mode by the operation input to the modulation selection unit 67 by the user, that is, specification of switching the waveform pattern of the modulation signal generated by the modulation signal generator 20 from the first pattern to the second pattern has been executed (step S7). On the other hand, in a case where the pattern switching input step is not executed, the processes after step S6 are executed again. On the other hand, in a case where the pattern switching input step is executed, the process of step S8 is continuously executed.

In step S8, when triggered by the operation input to the modulation selection unit 67 in the pattern switching input step, the modulation control unit 42 outputs the switching instruction for switching the waveform pattern of the modulation signal from the first pattern to the second pattern to the switching control unit 25 (modulation control step S8).

Next, the modulation signal generator 20 generates the modulation signal for one frame in the continuous mode (modulation signal generation step). Next, the modulation unit 35 frequency-modulates the reference signal output from the reference signal generation source 10 using the modulation signal output from the modulation signal generator 20 in the continuous mode to generate the SSC modulated signal (modulation step S9).

Next, the modulation signal generator 20 generates the modulation signal in the Steady-state mode (modulation signal generation step). Next, the modulation unit 35 frequency-modulates the reference signal output from the reference signal generation source 10 using the modulation signal output from the modulation signal generator 20 in the Steady-state mode to generate the SSC modulated signal (modulation step S10).

Next, the modulation control unit 42 determines whether or not the SSC modulation button 79 in the state in which "STOP" is displayed is pressed by the operation unit 40 (step S11). In a case where the SSC modulation button 79 in the state in which "STOP" is displayed is not pressed, the processes after step S10 are executed again. On the other hand, in a case where the SSC modulation button 79 in the state in which "STOP" is displayed is pressed, the modulation control unit 42 ends the series of spread spectrum clock generation process.

Hereinafter, details of the process of step S2 in the flowchart of FIG. 10 will be described with reference to the flowchart of FIG. 11.

First, information, such as the waveform type of the modulation signal, the modulation frequency, the amplitude of the frequency shift, and the time width of the time section, is input by the operation input to the setting screen 60 by the user (step S21). That is, step S21 includes a modulation frequency input step for setting the modulation frequency of the waveform of the modulation signal, and a time width input step for setting time widths of some of the plurality of time sections.

Next, the value of the frequency shift "Initial_Frequency" of the waveform of the modulation signal from the reference frequency Fc in the 0-th section is input by the operation input to the 0-th frequency shift input unit 71 by the user (0-th frequency shift input step S22).

Next, the value of the frequency shift "Overshoot_Peak" of the waveform of the modulation signal from the reference frequency Fc at the end of the first section is input by the operation input to the first frequency shift input unit 72 by the user (first frequency shift input step S23).

Next, the value of the frequency shift "Step1" of the waveform of the modulation signal in the second section is input by the operation input to the second frequency shift input unit 73 by the user (second frequency shift input step S24).

Next, the value of the frequency shift "Step2" of the waveform of the modulation signal in the third section is input by the operation input to the third frequency shift input unit 74 by the user (third frequency shift input step S25). In a case where the waveform of the modulation signal for DP1.4 is selected in the waveform selection unit 62, the process of the third frequency shift input step S25 is omitted.

Next, a minimum value of "Minimum_SSC_deviation" of the frequency shift of the waveform of the modulation signal is input by the operation input to the minimum frequency shift input unit 66 by the user (minimum frequency shift input step S26).

The processes of steps S22 to S26 described above corresponds to the frequency shift input step for arbitrarily setting the frequency shift of the waveform of the modulation signal in the plurality of time sections.

As described above, the SSC generator 1 according to the present embodiment displays the setting screen 60 for arbitrarily setting the frequency shift of the waveform of the modulation signal in the plurality of time sections, so that it is possible to improve usability when adjusting the waveform of the modulation signal during training. Further, in the SSC generator 1 according to the present embodiment, the setting screen 60 includes the modulation selection unit for switching the waveform pattern of the modulation signal generated by the modulation signal generator 20 from the first pattern to the second pattern, so that it is possible to perform, for example, seamless change from periodic burst mode to continuous mode.

Further, the SSC generator 1 according to the present embodiment can set the frequency shift of the waveform of the modulation signal during training for each time section on the setting screen 60, so that it is possible to arbitrarily set the frequency shift of the waveform of the modulation signal during training.

Further, the SSC generator 1 according to the present embodiment includes the time width calculation unit 42a that calculates the remaining time width of the time sections which are not set by the first section input unit 68, the second section input unit 69, and the third section input unit 70, so that it is possible to improve the usability by reducing the number of setting items of the user.

Further, the SSC generator 1 according to the present embodiment switches and illustrates the waveform images 76a and 76b between the periodic burst mode and the continuous mode in the waveform image display area 76, so that it is possible for the user to visually identify which mode of the modulation signal is output by the modulation signal generator 20.

Further, in the SSC generator 1 according to the present embodiment, in association with the waveform images 76a and 76b displayed in the waveform image display area 76, the first section input unit 68, the second section input unit 69, the third section input unit 70, the 0-th frequency shift input unit 71, the first frequency shift input unit 72, the second frequency shift input unit 73, and the third frequency shift input unit 74 are disposed. Therefore, the SSC generator 1 according to the present embodiment performs display so that the user can understand the items to be set at a glance, and makes the user to easily imagine the entire waveform of the modulation signal.

Further, in the SSC generator 1 according to the present embodiment, the setting screen 60 displays the first frequency shift input unit 72, the second frequency shift input unit 73, the third frequency shift input unit 74, the first section input unit. 68, the second section input unit 69, the third section input unit 70, and the slope absolute value information in a list format. Therefore, the SSC generator 1 according to the present embodiment can clearly display the frequency shift and the slope absolute value information for each time section for easy understanding of the user.

Further, the SSC generator 1 according to the present embodiment includes the waveform display screen 90 for performing display after updating the waveform graph of the modulation signal in response to the operation input with respect to the setting screen 60, so that it is possible to display time change of the waveform, which is difficult to understand in the waveform images 76a and 76b in the waveform image display area 76, such that the user can understand the time change of the waveform at a glance.

Further, since the SSC generator 1 according to the present embodiment can arbitrarily set the various parameters of the modulation signal on the setting screen 60, so that it is possible to generate various waveforms depending on the purpose without preparing a waveform file in advance. In particular, since the SSC generator 1 according to the present embodiment can set the various parameters of the modulation signal exceeding the standard requirements on the setting screen 60, so that it is possible to test the resistance of the DUT with respect to the non-standard SSC modulated signal.

Second Embodiment

Subsequently, a pulse pattern generator and a pulse pattern generation method, and an error rate measuring device and an error rate measuring method according to a second embodiment of the present invention will be described with reference to the drawings. The same components as those in the first embodiment are designated by the same reference numerals, and the description thereof will be omitted as appropriate. Further, the description of the same operation as that of the first embodiment will be omitted as appropriate.

Figure 12:
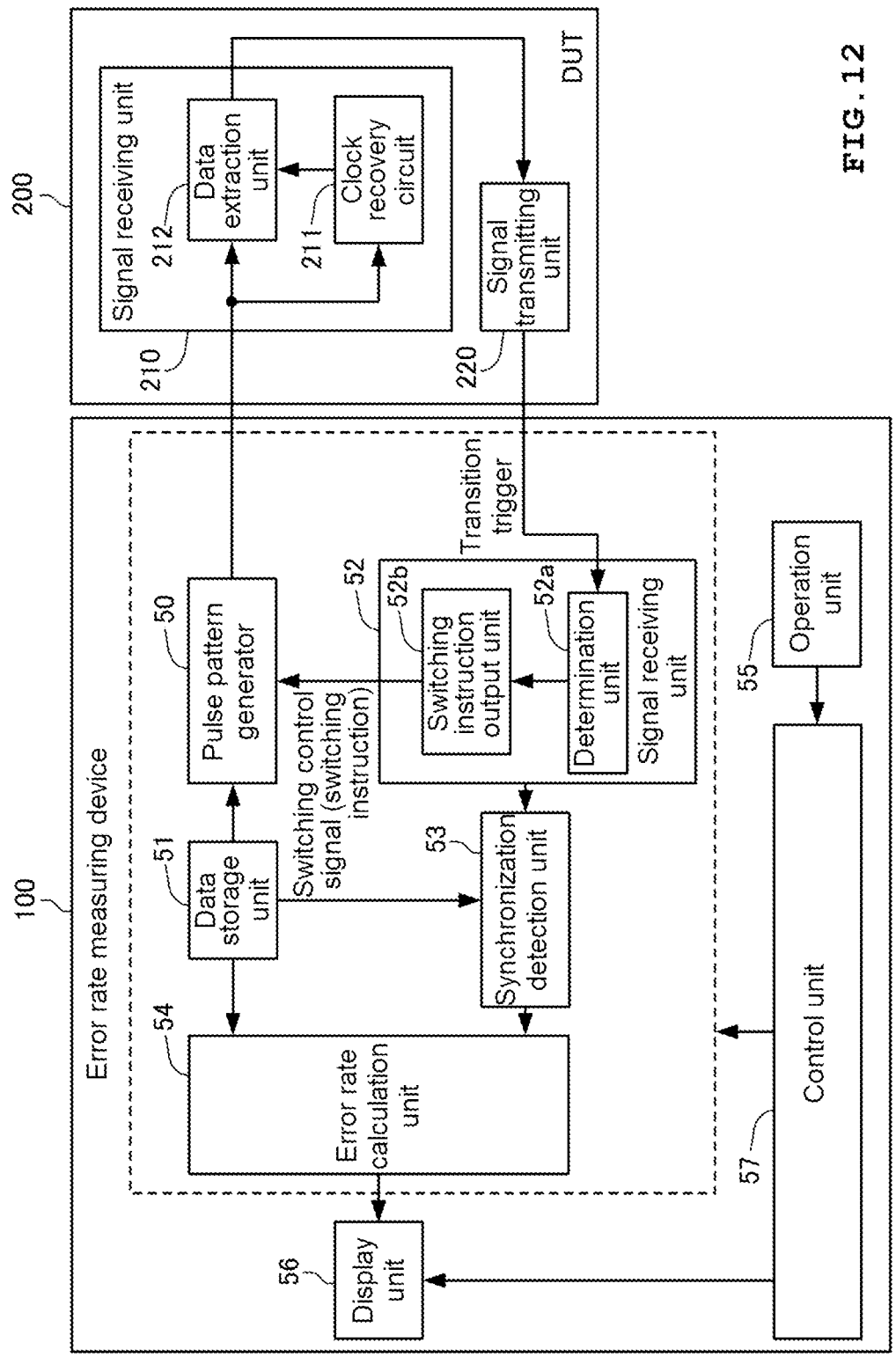
FIG. 12 is a block diagram illustrating a configuration of an error rate measuring device according to a second embodiment of the present invention.

As illustrated in FIG. 12, the error rate measuring device 100 according to the second embodiment measures the BER of the signal under measurement transmitted from the DUT 200, and includes a pulse pattern generator 50, a data storage unit 51, a signal receiving unit 52, a synchronization detection unit 53, an error rate calculation unit 54, an operation unit 55, a display unit 56, and a control unit 57.

The data storage unit 51 is configured with a memory such as a RAM, and stores in advance a reference data signal (data of low level voltage: "0" and high level voltage: "1").

Figure 13:
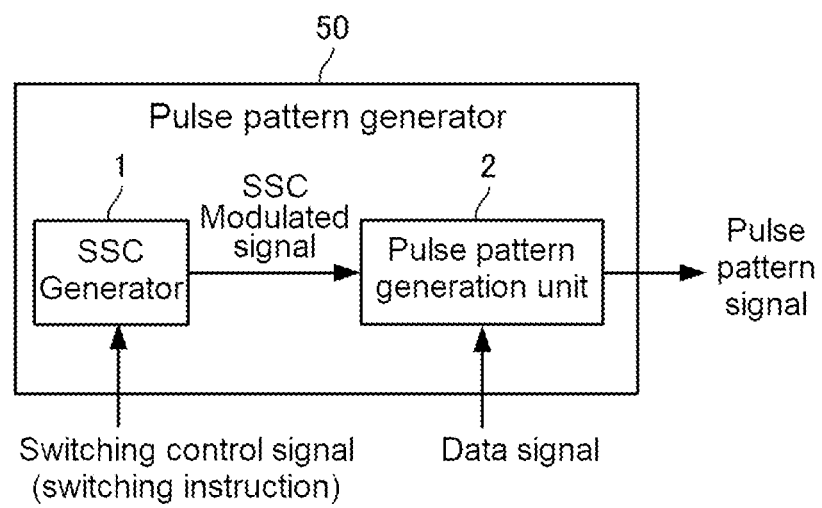
FIG. 13 is a block diagram illustrating a configuration of a pulse pattern generator included in the error rate measuring device according to the second embodiment of the present invention.

As illustrated in FIG. 13, the pulse pattern generator 50 generates a desired pulse pattern signal by using the spread spectrum SSC modulated signal, and includes the SSC generator 1 of the first embodiment and the pulse pattern generation unit 2.

The pulse pattern generator 50 generates a pulse pattern signal by modulating the data signal read from the data storage unit 51 with the SSC modulated signal generated by the SSC generator 1. Then, the pulse pattern generator 50 transmits the pulse pattern signal generated in this way to the DUT 200 as a test signal. At this time, the DUT 200 receives the pulse pattern signal transmitted from the pulse pattern generator 50, and transmits the received pulse pattern signal as a signal under measurement to the signal receiving unit 52.

The pulse pattern generation unit 2 uses the SSC modulated signal generated by the SSC generator 1 and the data signal input from the data storage unit 51 as inputs, and generates a pulse pattern signal with a desired repeating pattern in which the data signal is modulated with an SSC modulated signal. For example, the pulse pattern generation unit 2 generates a Pseudo-Random Bit Sequence (PRBS) pattern modulated by an SSC modulated signal as pulse pattern signals (test signals) of a known pattern to be input to the DUT 200, a continuous pattern of 0, 1 as a repeating signal, and a programmable pattern consisting of an arbitrary pattern.

The signal receiving unit 52 illustrated in FIG. 12 receives the signal under measurement, transmitted from the DUT 200, and outputs the received signal under measurement, to the synchronization detection unit 53. Further, the signal receiving unit 52 includes a determination unit 52a and a switching instruction output unit 52b.

The determination unit 52a determines whether or not the link state management mechanism mounted on the DUT 200 has transitioned to a predetermined state based on a transition trigger. Here, the transition trigger is a trigger indicating that the link state management mechanism of the DUT 200 has transitioned to the predetermined state, and may be transmitted from the DUT 200 or may be generated by the signal receiving unit 52 based on the signal under measurement transmitted from the DUT 200.

The switching instruction output unit 52b outputs the switching instruction to the switching control unit 25 of the SSC generator 1 in a case where the determination unit 52a determines that the link state management mechanism of the DUT 200 has transitioned to the predetermined state.

The synchronization detection unit 53 synchronizes the data signal read from the data storage unit 51 with the signal under measurement, output from the signal receiving unit 52. Then, the synchronization detection unit 53 outputs the signal under measurement in the synchronized state, to the error rate calculation unit 54.

The error rate calculation unit 54 compares the signal under measurement output from the DUT 200 in accordance with the input of the test signal for testing the DUT 200 with the test signal to calculate the error rate of the signal under measurement. For example, the error rate calculation unit 54 detects an error bit of the signal under measurement, by sequentially comparing the signal under measurement, output from the synchronization detection unit 53 with the data signal stored in the data storage unit 51, and calculates the BER of the signal under measurement.

The operation unit 55 is for receiving an operation input by the user, and is configured in the same manner as the operation unit 40 in the first embodiment, and the control unit 57 is notified of the user's contact operation to the input surface corresponding to the display screen of the display unit 56.

The display unit 56 is configured in the same manner as the display unit 41 in the first embodiment, and displays various display contents such as BER of the signal under measurement, calculated by the error rate calculation unit 54, based on the display control by the control unit 57.

The control unit 57 is configured in the same manner as the modulation control unit 42 in the first embodiment, and controls the operation of each of the above-described units constituting the error rate measuring device 100. Further, the control unit 57 can constitute at least a part of the error rate calculation unit 54 by software by transferring a predetermined program stored in the ROM or the like to the RAM and executing the program. At least a part of the error rate calculation unit 54 can be constituted by a digital circuit such as FPGA or ASIC. Alternatively, at least a part of the error rate calculation unit 54 can be constituted by appropriately combining a hardware process by a digital circuit and a software process by a predetermined program.

The operation unit 55, the display unit 56, and the control unit 57 in the present embodiment may also serve as the operation unit 40, the display unit 41, and the modulation control unit 42 in the first embodiment, respectively.

Figure 15:
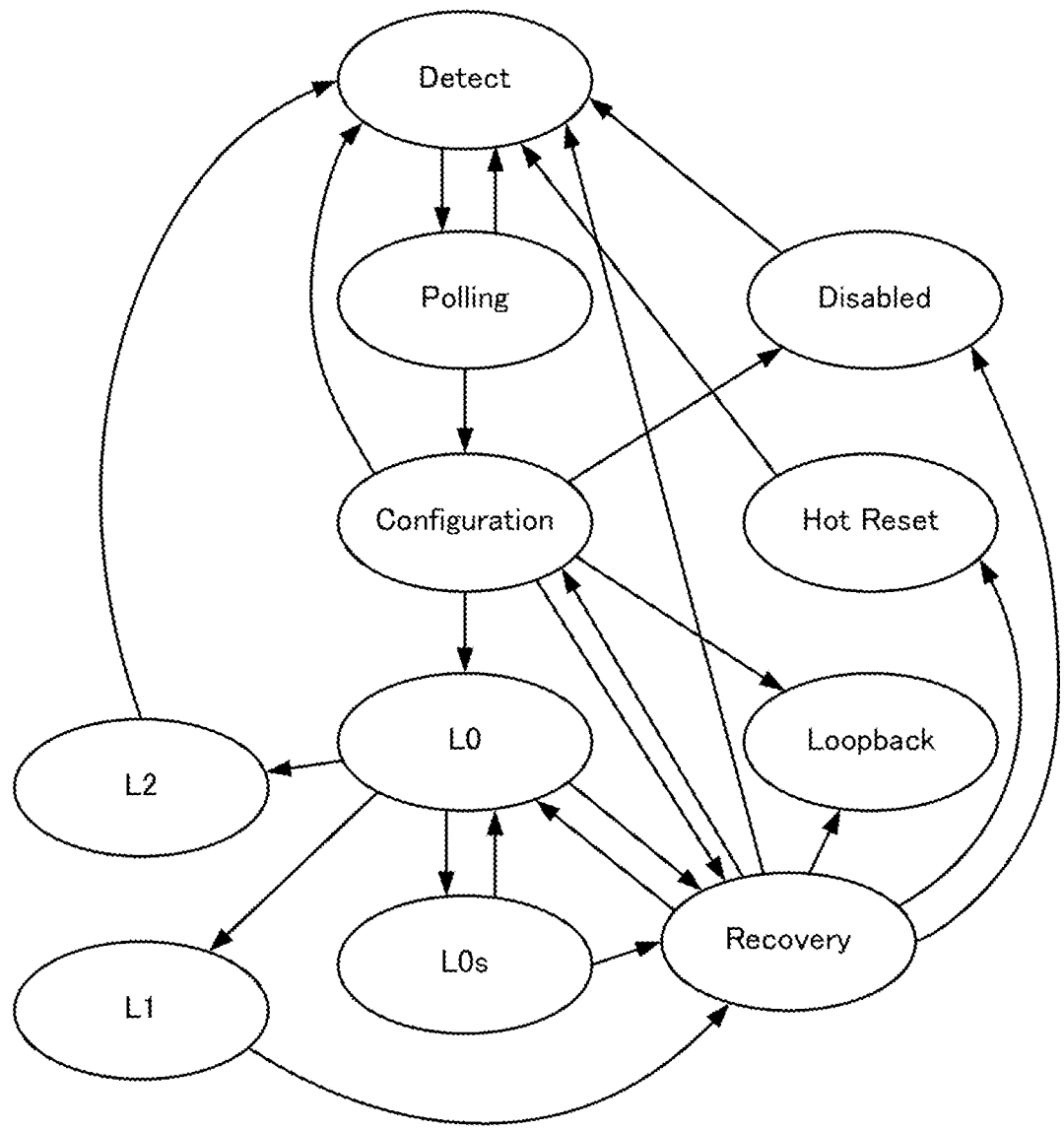
FIG. 15 is a diagram illustrating a state transition of a link state management mechanism.

The DUT 200 is equipped with a link state management mechanism, and in a state of transitioning to an arbitrary state as illustrated in FIG. 15, for example, the link state management mechanism outputs (returns) a test signal input from the error rate measuring device 100, as the signal under measurement of the error rate measuring device 100. Examples of the standards supported by the DUT 200 include PCIe Gen1 to 4, USB3.1 to 4, Display Port 1.4 (DP1.4), Common Electrical Interface (CEI), Ethernet (registered trademark), InfiniBand, and the like.

The DUT 200 includes a signal receiving unit 210 and a signal transmitting unit 220. Further, the signal receiving unit 210 includes a clock recovery circuit 211 and a data extraction unit 212.

The clock recovery circuit 211 generates a recovered clock signal from the test signal transmitted from the error rate measuring device 100. The data extraction unit 212 uses the recovered clock signal output from the clock recovery circuit 211 as an operation clock, extracts the data on the test signal input from the error rate measuring device 100, and outputs the extracted data to the signal transmitting unit 220. For example, the data extraction unit 212 has at least one 0/1 determination device, and when the recovered clock signal from the clock recovery circuit 211 is input to each 0/1 determination device, the level of the test signal transmitted from the error rate measuring device 100 can be determined at the timing of the recovered clock signal.

The signal transmitting unit 220 outputs the data on the test signal extracted by the data extraction unit 212 to the error rate measuring device 100 as a signal under measurement. Further, the signal transmitting unit 220 may transmit a transition trigger indicating that the link state management mechanism of the DUT 200 has transitioned to the predetermined state to the signal receiving unit 52 of the error rate measuring device 100.

Figure 14:
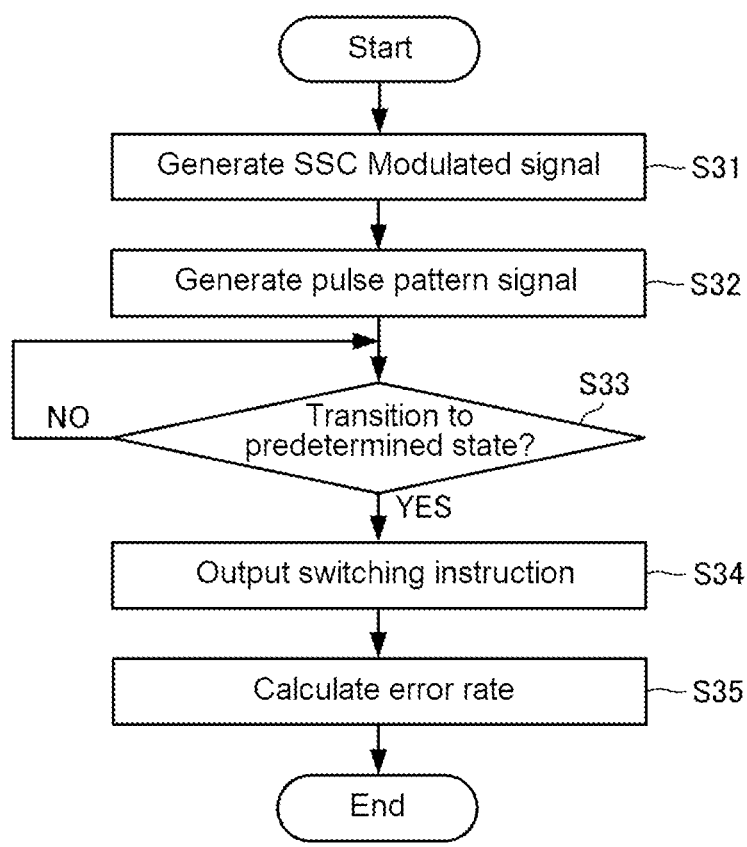
FIG. 14 is a flowchart illustrating a process of a pulse pattern generation method and an error rate measuring method according to the second embodiment of the present invention.

Hereinafter, an example of the process of the pulse pattern generation method and the error rate measuring method of the present embodiment will be described with reference to the flowchart of FIG. 14.

First, the SSC generator 1 of the pulse pattern generator 50 generates an SSC modulated signal (step S31).

Next, the pulse pattern generation unit 2 of the pulse pattern generator 50 modulates the data signal read from the data storage unit 51 with the SSC modulated signal to generate a pulse pattern signal with a desired repeating pattern (step S32).

Next, the determination unit 52a determines whether or not the link state management mechanism of the DUT 200 has transitioned to a predetermined state (determination step S33). The determination is performed based on whether or not the transition trigger has been transmitted from the DUT 200, or whether or not the signal receiving unit 52 has generated the transition trigger based on the signal under measurement transmitted from the DUT 200.

Next, in a case where it is determined that the link state management mechanism of the DUT 200 has transitioned to the predetermined state in the determination step S33, the switching instruction output unit 52b outputs the switching instruction to the switching control unit 25 of the SSC generator 1 (switching instruction output step S34).

Next, the error rate calculation unit 54 compares the signal under measurement output from the DUT 200 in accordance with the input of the test signal for testing the DUT 200 with the test signal to calculate the error rate of the signal under measurement (error rate calculation step S35). Here, the test signal is a pulse pattern signal generated in step S32.

As described above, the pulse pattern generator 50 according to the present embodiment can generate a pulse pattern signal with a desired repeating pattern, from the SSC modulated signal from the SSC generator 1 and the data signal input from the data storage unit 51.

Further, the error rate measuring device 100 according to the present embodiment can measure the error rate of the DUT 200, by using the pulse pattern signal modulated by the SSC modulated signal as a test signal in a case where the link state management mechanism of the DUT 200 transitions to the predetermined state.

DESCRIPTION OF REFERENCE NUMERALS AND SIGNS

1 SSC generator
2 Pulse pattern generation unit
10 Reference signal generation source
20 Modulation signal generator
35 Modulation unit
42 Modulation control unit
42a Time width calculation unit
42b Slope absolute value calculation unit
50 Pulse pattern generator
54 Error rate calculation unit 60 Setting Screen
64 Modulation frequency input unit
67 Modulation selection unit
68 First section input unit
69 Second section input unit
70 Third section input unit
71 0-th frequency shift input unit
72 First frequency shift input unit
73 Second frequency shift input unit
74 Third frequency shift input unit
76 Waveform image display area
76a, 76b Waveform image
77 Frequency shift settable location display unit
78 Time width settable location display unit
90 Waveform display screen
100 Error rate measuring device
200 DUT

What is claimed is:

1. A spread spectrum clock generator comprising:
a reference signal generation source that generates a reference signal of a reference frequency;
a modulation signal generator that generates a modulation signal;
a modulation unit that frequency-modulates the reference signal using the modulation signal to generate a spread spectrum clock signal;
a display unit that displays a setting screen for setting a parameter for determining a waveform of the modulation signal;
an operation unit that accepts an operation input with respect to the setting screen; and
a modulation control unit that controls the waveform of the modulation signal in response to the operation input with respect to the setting screen, wherein
the setting screen includes
a frequency shift input unit that arbitrarily sets a frequency shift of the waveform of the modulation signal in a plurality of time sections, and
a pattern switching input unit that switches a waveform pattern of the modulation signal from a first pattern to a second pattern, and
the modulation control unit switches the waveform pattern of the modulation signal from the first pattern to the second pattern when triggered by the operation input to the pattern switching input unit by the operation unit.

2. The spread spectrum clock generator according to claim 1, wherein
the frequency shift input unit includes
a 0-th frequency shift input unit that sets the frequency shift of the waveform of the modulation signal in a 0-th section of the plurality of time sections,
a first frequency shift input unit that sets the frequency shift of the waveform of the modulation signal at an end of a first section of the plurality of time sections,
a second frequency shift input unit that sets the frequency shift of the waveform of the modulation signal in a second section of the plurality of time sections, and
a third frequency shift input unit that sets the frequency shift of the waveform of the modulation signal in a third section of the plurality of time sections.

3. The spread spectrum clock generator according to claim 1, wherein
the setting screen further includes
a modulation frequency input unit that sets a modulation frequency of the waveform of the modulation signal, and
a time width input unit that sets time widths of some of the plurality of time sections, and
the modulation control unit includes a time width calculation unit for calculating remaining time widths of the time sections which are not set by the time width input unit based on the modulation frequency set by the modulation frequency input unit and some time widths set by the time width input unit.

4. The spread spectrum clock generator according to claim 1, wherein
the setting screen further includes a waveform image display area for displaying a schematic waveform image of the modulation signal, and
the waveform image display area performs display after switching a schematic waveform image of the first pattern to a schematic waveform image of the second pattern when triggered by the operation input to the pattern switching input unit by the operation unit.

5. The spread spectrum clock generator according to claim 4, wherein
the setting screen further includes
a frequency shift settable location display unit that indicates a location where the frequency shift can be set in the waveform of the modulation signal in association with the waveform image displayed in the waveform image display area, and
a time width settable location display unit that indicates a location where the time widths of the plurality of time sections can be set in the waveform of the modulation signal in association with the waveform image displayed in the waveform image display area, and
the frequency shift input unit and the time width input unit are disposed in the vicinities of the frequency shift settable location display unit and the time width settable location display unit, respectively.

6. The spread spectrum clock generator according to claim 3, wherein
the modulation control unit further includes a slope absolute value calculation unit that calculates an absolute value of a slope of the frequency shift of the waveform of the modulation signal for each time section based on the frequency shift for each time section set by the frequency shift input unit, the time width for each time section set by the time width input unit, and the time width calculated by the time width calculation unit, and
the display unit displays the frequency shift input unit, the time width input unit, and the absolute value of the slope calculated by the slope absolute value calculation unit in a list format on the setting screen.

7. The spread spectrum clock generator according to claim 1, wherein
the display unit further displays a waveform display screen for performing display after updating a graph of the waveform of the modulation signal in response to the operation input with respect to the setting screen.

8. A spread spectrum clock generation method comprising:
- a reference signal generation step of generating a reference signal of a reference frequency;
- a modulation signal generation step of generating a modulation signal;
- a modulation step of frequency-modulating the reference signal using the modulation signal to generate a spread spectrum clock signal;
- a display step of displaying a setting screen for setting a parameter for determining a waveform of the modulation signal;
- an operation step of accepting an operation input with respect to the setting screen; and
- a modulation control step of controlling the waveform of the modulation signal in response to the operation input with respect to the setting screen, wherein the operation step includes
- a frequency shift input step of arbitrarily setting a frequency shift of the waveform of the modulation signal in a plurality of time sections, and
- a pattern switching input step of switching a waveform pattern of the modulation signal from a first pattern to a second pattern, and the modulation control step includes switching the waveform pattern of the modulation signal from the first pattern to the second pattern when triggered by the operation input in the pattern switching input step.

9. The spread spectrum clock generation method according to claim 8, wherein the frequency shift input step includes
- a 0-th frequency shift input step of setting the frequency shift of the waveform of the modulation signal in a 0-th section of the plurality of time sections,
- a first frequency shift input step of setting the frequency shift of the waveform of the modulation signal at an end of a first section of the plurality of time sections,
- a second frequency shift input step of setting the frequency shift of the waveform of the modulation signal in a second section of the plurality of time sections,
- a third frequency shift input step of setting the frequency shift of the waveform of the modulation signal in a third section of the plurality of time sections, and
- a minimum frequency shift input step of setting a minimum value of the frequency shift of the waveform of the modulation signal.

10. The spread spectrum clock generation method according to claim 8, wherein the display step includes further displaying a waveform display screen for performing display after updating a graph of the waveform of the modulation signal in response to the operation input with respect to the setting screen.

11. A pulse pattern generator that generates a pulse pattern signal by using the spread spectrum clock signal generated by the spread spectrum clock generator according to claim 1.

12. A pulse pattern generation method comprising: a step of generating a pulse pattern signal by using the spread spectrum clock signal generated by the spread spectrum clock generation method according to claim 8.

13. An error rate measuring device comprising:
- the pulse pattern generator according to claim 11; and
- an error rate calculation unit that compares a signal under measurement output from a device under test in accordance with an input of a test signal for testing the device under test with the test signal to calculate an error rate of the signal under measurement, wherein
- the test signal is the pulse pattern signal generated by the pulse pattern generator.

14. An error rate measuring method comprising:
- the pulse pattern generation method according to claim 12; and
- an error rate calculation step of comparing a signal under measurement output from a device under test in accordance with an input of a test signal for testing the device under test with the test signal to calculate an error rate of the signal under measurement, wherein
- the test signal is the pulse pattern signal generated by the pulse pattern generation method.

* * * * *